United States Patent
Yamazaki et al.

(10) Patent No.: US 7,520,790 B2
(45) Date of Patent: Apr. 21, 2009

(54) DISPLAY DEVICE AND MANUFACTURING METHOD OF DISPLAY DEVICE

(75) Inventors: Shunpei Yamazaki, Tokyo (JP); Masayuki Sakakura, Kanagawa (JP); Masaharu Nagai, Kanagawa (JP); Yutaka Matsuda, Tochigi (JP); Kengo Akimoto, Kanagawa (JP); Gen Fujii, Kanagawa (JP); Tetsuji Yamaguchi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 469 days.

(21) Appl. No.: 10/939,959

(22) Filed: Sep. 14, 2004

(65) Prior Publication Data

US 2005/0062409 A1 Mar. 24, 2005

(30) Foreign Application Priority Data

Sep. 19, 2003 (JP) ............................. 2003-328928

(51) Int. Cl.
*H01J 9/20* (2006.01)
*H01L 51/40* (2006.01)
(52) U.S. Cl. ..................... 445/24; 313/506; 313/504
(58) Field of Classification Search ................. 313/504, 313/506; 445/24, 25; 427/66
See application file for complete search history.

(56) References Cited

U.S. PATENT DOCUMENTS

| | | | |
|---|---|---|---|
| 5,831,708 A | 11/1998 | Hiraishi et al. | |
| 5,981,092 A * | 11/1999 | Arai et al. | 428/690 |
| 6,596,571 B2 | 7/2003 | Arao et al. | |
| 6,599,785 B2 | 7/2003 | Hamada et al. | |
| 6,599,788 B1 | 7/2003 | Kawasaki et al. | |
| 6,635,505 B2 | 10/2003 | Tanaka et al. | |
| 6,781,148 B2 | 8/2004 | Kubota et al. | |
| 6,821,827 B2 | 11/2004 | Nakamura et al. | |
| 6,828,725 B2 | 12/2004 | Kimura | |
| 6,872,607 B2 | 3/2005 | Tanaka | |
| 6,882,264 B2 | 4/2005 | Cunningham | |
| 6,919,282 B2 | 7/2005 | Sakama et al. | |
| 6,946,330 B2 | 9/2005 | Yamazaki et al. | |
| 7,105,365 B2 | 9/2006 | Hiroki et al. | |
| 7,115,453 B2 | 10/2006 | Nakamura et al. | |
| 7,115,488 B2 * | 10/2006 | Isobe et al. | 438/491 |
| 7,118,943 B2 | 10/2006 | Yudasaka et al. | |
| 7,306,978 B2 | 12/2007 | Yamazaki et al. | |

(Continued)

FOREIGN PATENT DOCUMENTS

JP 09-236826 9/1997

*Primary Examiner*—Karabi Guharay
(74) *Attorney, Agent, or Firm*—Eric J. Robinson; Robinson Intellectual Property Law Office, P.C.

(57) ABSTRACT

It is an object of the present invention to provide a reliable display device and a method for manufacturing the display device reducing the number of manufacturing steps, and with higher yield. A display device according to the invention includes a plurality of display elements each having a first electrode, a layer containing an organic compound, and a second electrode. The display device further includes a heat-resistant planarizing film over a substrate having an insulating surface, a first electrode over the heat-resistant planarizing film, a wiring covering an end portion of the first electrode, a partition wall covering the end portion of first electrode and the wiring, a layer containing an organic compound, and a second electrode over the layer containing an organic compound.

28 Claims, 17 Drawing Sheets

U.S. PATENT DOCUMENTS

| | | |
|---|---|---|
| 2001/0026835 A1 | 10/2001 | Tanaka |
| 2001/0034088 A1 | 10/2001 | Nakamura et al. |
| 2002/0004298 A1* | 1/2002 | Sugahara et al. ............ 438/623 |
| 2002/0016028 A1 | 2/2002 | Arao et al. |
| 2002/0047514 A1* | 4/2002 | Sakurai et al. .............. 313/503 |
| 2002/0101152 A1 | 8/2002 | Kimura |
| 2002/0119606 A1 | 8/2002 | Hamada et al. |
| 2002/0132383 A1 | 9/2002 | Hiroki et al. |
| 2002/0134981 A1 | 9/2002 | Nakamura et al. |
| 2003/0064552 A1 | 4/2003 | Tanaka et al. |
| 2003/0071303 A1 | 4/2003 | Yamazaki et al. |
| 2003/0094615 A1 | 5/2003 | Yamazaki et al. |
| 2003/0127651 A1* | 7/2003 | Murakami et al. ............ 257/72 |
| 2004/0007748 A1 | 1/2004 | Sakama et al. |
| 2004/0082195 A1 | 4/2004 | Yudasaka et al. |
| 2004/0263072 A1* | 12/2004 | Park et al. ................... 313/509 |
| 2005/0045891 A1 | 3/2005 | Yamazaki et al. |
| 2005/0052127 A1* | 3/2005 | Sakata et al. ................ 313/506 |
| 2005/0062057 A1 | 3/2005 | Yamazaki et al. |
| 2005/0067953 A1 | 3/2005 | Yamazaki et al. |
| 2008/0088245 A1 | 4/2008 | Yamazaki et al. |

* cited by examiner

DISPLAY DEVICE AND MANUFACTURING METHOD OF DISPLAY DEVICE

BACKGROUND OF THE INVENTION

1. Field of the Invention

The invention relates to a display device having an element in which a light emitting material is sandwiched between electrodes (hereinafter referred to as a light emitting element).

2. Description of the Related Art

Recently, the development of a liquid crystal display device and an electroluminescent display device in which thin film transistors (TFTs) are integrated over a glass substrate has been in progress. As to each of such display devices, TFTs are manufactured over a glass substrate by thin film formation technologies, and a liquid crystal element or a light emitting element (electroluminescent (hereinafter simply referred to as EL) element) formed over various circuits configured with the thin film transistors, thus functions as a display device.

A circuit formed with TFTs has some surface irregularities, hence in forming the liquid crystal elements or the light emitting elements over the circuit, the circuit is generally planarized with an organic resin film or the like (Reference 1: Japanese Patent Laid-Open No. 9-236826). Each pixel provided for a display area of a display device includes a pixel electrode inside, and the pixel electrode is connected to a TFT through a contact hole formed in the organic resin film used for planarization.

(Patent Document 1)

Japanese Patent Laid-Open No. 9-236826

SUMMARY OF THE INVENTION

In the display device (panel) using the above light emitting element, the moisture which enters inside leads a serious decrease in reliability, and a dark spot, shrink, and reduction in luminance from a peripheral part of a display device. The dark spot is a phenomenon in which luminance reduces (or vanishes) partially, and which occurs, for example, when a top electrode has a hole. The shrink is a phenomenon in which luminance reduces from an end portion (edge) of a pixel.

In manufacturing steps of a display device, it is advantageous to perform heat treatment and the like for removing moisture and improving the reliability. Accordingly, an interlayer insulating film used for planarization is required to be highly heat resistant and electrically insulative, and having high planarization coefficient.

It is an object of the present invention to provide a reliable display device and a method for manufacturing the display device, reducing the number of manufacturing steps, and with higher yield.

According to the invention, an interlayer insulating film for planarization is required to be highly heat resistant and electrically insulative, and having high planarization coefficient. Such an interlayer insulating film is preferably formed by a coating method such as spin coating rather than by deposition method such as CVD.

Specifically, it is preferable to use a heat-resistant planarizing film obtained by the coating method for an interlayer insulating film and a partition wall. As a material for the interlayer insulating film and the partition wall, a coating film in which a skeletal structure is constructed by allowing silicon (Si) and oxygen (O) to bond with each other, and a substituent contains at least one of hydrogen, fluorine, an alkyl group, and aromatic hydrocarbon is used. The coating film is then baked, thereby obtaining a SiOx film containing an alkyl group. The SiOx film containing an alkyl group has higher light transmitting properties than those of acrylic resin, and can withstand a heat treatment at a temperature of 300° C. or more.

In the invention, the method for forming an interlayer insulating film by a coating method is shown in the following. Initially, thinner pre-wet treatment is performed to improve wettability after performing washing with purified water. A liquid material called varnish, in which a low-molecular weight component (precursor) including a silicon (Si)-oxygen (O) bond is dissolved in a solvent, is applied over the substrate by spin coating or the like. Thereafter, the varnish coating the substrate is heated to volatilize (or evaporate) the solvent and to develop cross-linking reaction of the low-molecular weight compound, thereby obtaining a thin film. The coating film formed at the periphery of the substrate is partially removed. In the case of forming the partition wall, the resultant coating film may be patterned to a predetermined shape. The film thickness of the thin coating film is controlled by varying the spin number; rotation time; and density and viscosity of the varnish.

By forming the interlayer insulating film and the partition wall of the same material, manufacturing costs can be reduced. In addition, costs can be reduced by sharing a device such as a device for forming a coating film and an etching device.

An EL element using a layer containing an organic compound as a light emitting layer generally use ITO (indium tin oxide) as a first electrode (an anode or cathode). However, the refractive index of ITO is as high as about 2. Correspondingly, in the present invention, the first electrode is formed of indium tin oxide containing silicon oxide (hereinafter referred to as "ITSO"). When ITSO is baked, ITSO remains in amorphous state while ITO is crystallized by bake. As compared with ITO, ITSO has superior leveling properties, and short circuit to a cathode hardly occurs even if the layer including an organic compound is thin in thickness. Accordingly, the ITSO is more suitable for the anode of the display element than ITO. Furthermore, ITSO is added with silicon oxide having a refractive index of around 1.46 such that the refractive index of the ITSO, which serves as the anode, is varied properly.

Further, as to a display device using ITSO for an electrode and using a heat-resistant planarizing film obtained by a coating method for an interlayer insulating film, heat generation of the display device is suppressed; thus, the reliability of the display device is improved.

As to a display element according to the invention, a stack which light emitted from a light emitting layer is transmitted therethrough to the outside of a substrate is formed from a highly light transmitting material; thus, the luminous efficiency is improved.

Further, light from the display element is reflected and diffused in different directions, and absorbed by different parts (material layers). According to the invention, parts which light is not transmitted therethrough to the outside of a substrate, for example, a partition wall, are formed of a highly light transmitting material, and the luminous efficiency can be improved by reducing absorption of the light in the parts.

Further, in the invention, the source electrode and the drain electrode that are to be wirings are formed on a first electrode to be an anode or a cathode. As to the formation of the wirings, since the first electrode is used as a stopper in etching, a layer serving as an etching stopper is not necessary; thus, the process is simplified. Consequently, display devices can be manufactured with higher yield and at lower cost.

A display device according to the invention includes: a substrate having an insulating surface; a heat-resistant planarizing film over the substrate having the insulating surface; a first electrode on the heat-resistant planarizing film; a wiring covering an end portion of the first electrode; a partition wall covering the end portion of the first electrode and the wiring; a layer containing an organic compound on the first electrode; and a second electrode on the layer containing an organic compound. Further, the display device includes a plurality of display elements each including the first electrode, the layer containing an organic compound, and the second electrode.

According to the above structure, the heat-resistant planarizing film and the partition wall are formed of the same material and a SiOx film having an alkyl group can be used for the material. Further, the first electrode can use indium tin oxide containing silicon oxide (SiOx).

A display device according to the invention includes a plurality of display elements each having a first electrode, a layer containing an organic compound, and a second electrode. In a light-emitting area, light from the display element is transmitted through the first electrode, the heat-resistant planarizing film containing silicon oxide (SiOx), and a substrate having an insulating surface.

Further according to each structure above, the light emitting element can emit red, green, blue, or white light.

According to one aspect of the invention, a method for manufacturing a display device having a thin film transistor and a display element over a first substrate with an insulating surface, includes the steps of: forming a thin film transistor having a gate insulating film, a gate electrode and a semiconductor layer having a source region, a drain region and a channel forming region between the source and drain regions over the first substrate with an insulating surface; forming a heat-resistant planarizing film on irregularities due to the thin film transistor; selectively forming a first electrode on the heat-resistant planarizing film; selectively removing the heat-resistant planarizing film so as to form an opening disposed above the source region or the drain region; selectively removing the gate insulating film so as to form a contact hole, which reaches to the source region or the drain region; forming a conductive film on the first electrode and the heat-resistant planarizing film; selectively removing the conductive film and the heat-resistant planarizing film; forming a source electrode and a drain electrode which respectively reach the source region and the drain region, and a depression in the heat-resistant planarizing film; forming a partition wall which covers the source electrode and the drain electrode, an end portion of the first electrode, and the depression in the heat-resistant planarizing film; forming a layer containing an organic compound on the first electrode; forming a second electrode on the layer containing an organic compound; and encapsulating a second substrate to the first substrate with a sealant.

In the above-mentioned structure, the heat-resistant planarizing film or the partition wall may use a silicon oxide (SiOx) film having an alkyl group formed by a coating method. Further, the anode may be formed by sputtering using a target composed of indium tin oxide containing silicon oxide (SiOx).

Further, in the above-described structure, the display device is applicable to either an active matrix light emitting display device or a passive matrix light emitting display device.

A light emitting element (EL element) which is a display element has a layer containing an organic compound which generates electroluminescence by being applied with an electric field (hereinafter referred to as an EL layer), an anode, and a cathode. Luminescence generated in the organic compound includes luminescence that is generated when an singlet excited state returns to a ground state (fluorescence) and luminescence that is generated when an triplet exited state returns to a ground state (phosphorescence). The display device manufactured according to the invention is applicable to each case of using fluorescence and phosphorescence.

The light emitting element (EL element) including an EL layer has a structure in which the EL layer is sandwiched between a pair of electrodes. The EL layer generally has a layered structure. Typically, a layered structure of: a hole transport layer/a light emitting layer/an electron transporting layer in this order is known. This structure of the EL layer exhibits extremely high light-emitting efficiency. Therefore, this layered structure is used in almost all of display devices which have been researched and developed now.

Another structure in which an anode, a hole injection layer, a hole transport layer, a light emitting layer, and an electron transport layer are stacked in this order; or a structure in which an anode, a hole injection layer, a hole transport layer, a light emitting layer, an electron transport layer, and an electron injection layer are stacked in this order may be used. The light emitting layer may be doped with fluorescent pigment or the like. Further, each of the layers may be composed of either a low-molecular weight material or a high-molecular weight material. A layer containing an inorganic compound may also be used. In this specification, a stack of all layers formed between an electrode serving as a cathode and an electrode serving as an anode are generically referred to as the EL layer. Accordingly, the EL layer includes all of the hole injection layer, hole transport layer, light emitting layer, electron transport layer, and electron injection layer.

In the light emitting display device of the invention, the method for driving screen display is not particularly limited. For example, a dot sequential driving method, a line sequential driving method, a surface sequential driving method, or the like may be used. A line sequential driving method is typically used, and a time gray scale driving method or an area gray scale driving method may also be appropriately employed. Further, image signals input to a source line of the light emitting display device may be either analog signals or digital signals. Driver circuits and the like may be appropriately designed according to the image signals.

Light emitting display devices using digital video signals includes ones in which video signals are input to a pixel at a constant voltage (CV), and ones in which video signals are input to a pixel at a constant current (CC). The light emitting devices in which video signals are input to a pixel at a constant voltage (CV) are further classified into ones in which a constant voltage is applied to a light emitting element (CVCV), and others in which a constant current is applied to a light emitting element (CVCC). Also, the light emitting device in which video signals are input to a pixel at a constant current (CC) is classified into ones in which a constant voltage is applied to a light emitting element (CCCV), and others in which a constant current is supplied to a light emitting element (CCCC).

In this specification, the light transmittance indicates a ratio of light released out through the transparent substrate to initial light from the light emitting element.

The invention can be applied to any TFT structure, for example, a top-gate TFT, a bottom-gate (inverted-staggered type) TFT, or a staggered TFT.

As for an active layer of a TFT, an amorphous semiconductor film, a semiconductor film having a crystalline structure, a compound semiconductor film having an amorphous structure, and the like can be arbitrarily used. Alternativly, the active layer of the TFT may be formed of a semiamorphous semiconductor film (also referred to as a microcrystalline semiconductor film) having an intermediate structure between an amorphous structure and a crystalline structure (including a single crystalline structure, and a polycrystalline structure). The semiamorphous semiconductor film has a third condition that is stable with respect to free energy, and includes a crystalline region having short-distance order and lattice distortion. Further, at least a part of the semiamorphous semiconductor film includes a crystal grain of from 0.5 nm to 20.0 nm in size, and Raman spectrum is shifted to a lower wavenumber than 520 $cm^{-1}$. The diffraction peak of (111) and (220), which is believed to be originated in a crystalline silicon lattice, is observed in the semiamorphous semiconductor film by X-ray diffraction. Further, the semiamorphous semiconductor film is added with hydrogen or halogen of at least 1 atom % as a terminator for dangling bonds. The semiamorphous semiconductor film is formed by glow discharge decomposition with silicide gas (by plasma CVD). As for the silicide gas, $Si_2H_6$, $SiH_2Cl_2$, $SiHCl_3$, $SiCl_4$, $SiF_4$, and the like can be used, besides $SiH_4$. The silicide gas may also be diluted with $H_2$ or a mixture of $H_2$ and at least one rare gas selected from the group consisting of He, Ar, Kr, and Ne. The dilution ratio may be in the range of from 1:2 to 1:1,000. The pressure may be approximately in the range of from 0.1 Pa to 133 Pa. The power frequency is in the range of from 1 MHz to 120 MHz, preferably 13 MHz to 60 MHz. The substrate heating temperature may be set at 300° C. or less, preferably from 100° C. to 250° C. As for impurity elements contained in the film, each concentration of impurities in atmospheric constituents such as oxygen, nitrogen, and carbon is preferably set at $1 \times 10^{20}$ $cm^{-1}$ or less. In particular, the oxygen concentration is set at $5 \times 10^{19}$ $atoms/cm^3$ or less; more preferably, $1 \times 10^{19}$ $atoms/cm^3$ or less. The electric field effect mobility μ of the TFT using the semiamorphous semiconductor film as the active layer is in the range of from 1 $cm^2/Vsec$ to 10 $cm^2/Vsec$.

According to a heat resistant planarizing film of the invention, wiring defects of a display element can be prevented by eliminating irregularities due to a gate electrode or a semiconductor layer in a display device forming a TFT. The heat resistant planarizing film of the invention can have high light transmittance and preferable display properties.

In addition, in a light emitting display device using a layer containing an organic compound as a light emitting layer; the reliability can be improved by providing an interlayer insulating film which has the small amount of dehydration and degasification.

By using a structure of the display device according to the invention, the number of steps is simplified and display devices can be manufactured with higher yield and at lower cost.

DETAILED DESCRIPTION OF THE INVENTION

EMBODIMENT MODE

Figure 1A:
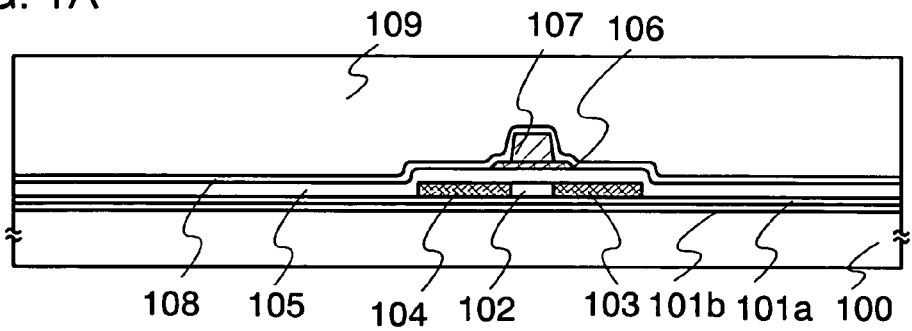
FIGS. 1A to 1D are figures showing a structure according to the present invention.

Embodiment modes of the present invention will be described below.

As a base film 101, a silicon nitride oxide film 101b with a thickness of 10 nm to 200 nm (preferably, from 50 nm to 100 nm) is formed on a substrate 100 having an insulating surface, and a silicon oxynitride film with a thickness of 50 nm to 200 nm (preferably, from 100 nm to 150 nm) is stacked thereover by plasma CVD. As for the substrate 100, a glass substrate, a quartz substrate, a silicon substrate, a metal substrate, or a stainless substrate each of which has an insulating film on its surface may be used. In addition, a plastic substrate or a flexible substrate, which can withstand processing temperatures in this embodiment mode, may be used. Further, a two-layer structure may be used for the base film, and a single-layer film or a layered structure having more than two layers of the base (insulating) film may also be used.

Subsequently, a semiconductor film is formed on the base film. The semiconductor film may be formed with a thickness of 25 nm to 200 nm (preferably, from 30 nm to 150 nm) by a known technique (sputtering, LPCVD, plasma CVD, or the like). A material for the semiconductor film is not particularly limited, however, the semiconductor film is preferably formed of silicon or silicon germanium (SiGe) alloy.

A semiconductor film uses an amorphous semiconductor (typically hydrogenated amorphous silicon) or a crystalline semiconductor (typically polysilicon) as a material. Polysilicon includes what is called high-temperature polysilicon which uses polycrystalline silicon processed at 800° C. or more as a main component, what is called low temperature polysilicon which uses polycrystalline silicon processed at 600° C. or less, and crystalline silicon which is crystallized by being added with an element promoting crystallization, or the like.

As another material, a semiamorphous semiconductor film or a semiconductor film, a part of which has crystal phase may be used. A semiamorphous semiconductor has an intermediate structure between amorphous structure and crystalline structure (including single crystal and polycrystal). The semiamorphous semiconductor has a third condition that is stable with respect to free energy, and includes a crystalline region having short-distance order and lattice distortion. Typically, the semiamorphous semiconductor contains silicon as a main component, and Raman spectrum is shifted to a lower wavenumber than 520 cm$^{-1}$ with the distortion. Hydrogen or halogen of at least 1 atom % as a terminator for dangling bonds is added. Here, such a semiconductor is referred to as a semiamorphous semiconductor (abbreviated as an SAS). The SAS is also called a microcrystalline semiconductor (typically, microcrystalline silicon).

The SAS can be obtained by glow discharge decomposition of silicide gas. Typically, SiH$_4$ is used as a silicide gas, though Si$_2$H$_6$, SiH$_2$Cl$_2$, SiHCl$_3$, SiCl$_4$, SiF$_4$ or the like may be used as well. The formation of the SAS can be facilitated by using the silicide gas, which is diluted with hydrogen or a mixture of hydrogen and at least one rare gas selected from the group consisting of helium, argon, krypton, and neon. A dilution ratio of hydrogen against the silicide gas is, for example, preferably in the range of from 5 times to 1000 times in terms of flow volume ratio. Naturally, it is preferable that the formation of SAS by glow discharge decomposition is performed under reduced pressure, the formation can also be performed by using discharge at atmospheric pressure. As a representative example, the formation may be performed in the pressure range of from 0.1 Pa to 133 Pa. The power supply frequency for generating the glow discharge is in the range of 1 MHz to 120 MHz, and more preferably, in the range of 13 MHz to 60 MHz. A high-frequency power supply may be set appropriately. A temperature for heating the substrate is preferably 300° C. or less, and the temperature in the range of from 100° C. to 200° C. is also permissible. Among impurity elements which are mainly added in forming a film, atmospheric elements such as oxygen, nitrogen and carbon desirably have a concentration of $1\times10^{20}$ cm$^{-3}$ or less. In particular, the concentration of oxygen is $5\times10^{19}$ cm$^{-3}$ or less, and more preferably $1\times10^{19}$ cm$^{-3}$ or less. Better SAS can be obtained by adding a rare gas element such as helium, argon, krypton, neon, or the like, thereby promoting lattice distortion; thus, the stability is improved.

In this embodiment mode, the amorphous silicon film may be crystallized by thermal crystallization and laser crystallization with the use of a metal element for promoting crystallization. Alternatively, without introducing the metal element into the amorphous silicon film, hydrogen included in the amorphous silicon film may be released to lower hydrogen concentration to $1\times10^{20}$ atoms/cm$^3$ or less by heating under a nitrogen atmosphere at a temperature of 500° C. for one hour. Thereafter, the laser crystallization may be performed. The dehydrogenation is performed because the amorphous silicon film is damaged by laser irradiation when the film contains much hydrogen.

Nickel is used as the metal element, and is doped into the amorphous silicon film by solution coating method. The method of doping the metal element into the amorphous silicon film is not particularly limited on condition that the metal element can be on the surface thereof or inside the amorphous silicon film. For example, a method such as sputtering, CVD, plasma processing (including plasma CVD), adsorption, and a method for applying a metal salt solution can be employed. Among them, the method using the metal salt solution is simply and easily performed, and is useful for easily adjusting concentration of the metal element. At this time, an oxide film is preferably formed by ultraviolet (UV) ray irradiation under an oxygen atmosphere, thermal oxidation, treatment with ozone water or hydrogen peroxide including hydroxyl radical, and the like in order to improve wettability of the surface of the amorphous silicon film and to spread aqueous solution over the entire surface of the amorphous silicon film.

Subsequently, heat treatment is performed at a temperature of 500° C. to 550° C. for 4 hours to 20 hours to crystallize the amorphous silicon film; thus a first crystalline silicon film is formed.

Next, the first crystalline silicon film is irradiated with a laser beam to promote crystallization, and thus, a second crystalline silicon film is obtained. Laser crystallization is performed by irradiating the semiconductor film with a laser beam. A pulsed or continuous oscillation solid-state laser, a gas laser, or a metal laser is preferably used for the laser crystallization. The solid-state laser includes YAG laser, YVO$_4$ laser, YLF laser, YAlO$_3$ laser, glass laser, ruby laser, alexandrite laser, Ti:sapphire laser, and the like. The gas laser includes excimer laser, Ar laser, Kr laser, CO$_2$ laser, and the like. The metal laser includes helium cadmium laser, copper vapor laser, and gold vapor laser. The laser beam may be converted to higher harmonics by a nonlinear optical element. A crystal used for the nonlinear optical element such as LBO, BBO, KDP, KTP, KB5, and CLBO is superior in conversion efficiency. The conversion efficiency can be drastically increased by incorporating such a nonlinear optical element into a laser resonator. A laser of the higher harmonics is typically doped with Nd, Yb, Cr, and the like, and these are excited to oscillate laser beam. The type of a dopant may be appropriately selected by those who operate the present invention. The semiconductor film includes an amorphous semiconductor film, a microcrystalline semiconductor film, and a crystalline semiconductor film; further, a compound semiconductor film having an amorphous structure such as an amorphous silicon germanium film or an amorphous silicon carbide film may also be used.

A minute amount of impurity elements (boron or phosphorous) is doped into thus obtained crystalline semiconductor film to control the threshold value of a TFT.

A first photomask is formed and patterned by photolithography so as to form a semiconductor layer 102.

Subsequently, a gate insulating film 105 covering the semiconductor layer 102 is formed. The gate insulating film 105 is formed with an insulating film containing silicon with a thickness of 40 nm to 150 nm by plasma CVD or sputtering. The material for the gate insulating film is not limited to a silicon oxynitride film, and other insulating films with a single layer structure or a layered structure may be used.

A first conductive film with a film thickness of 20 nm to 100 nm and a second conductive film with a film thickness of 100 nm to 400 nm, each of which serves as a gate electrode are formed and stacked over the gate insulating film 105. The first and the second conductive films may be made of an element selected from Ta, W, Ti, Mo, Al, and Cu, or an alloy material or a compound material having the foregoing element as a main component. A semiconductor film represented by a polycrystalline silicon film that is doped with an impurity element such as phosphorus or AgPdCu alloy may be used as the first and the second conductive films. The conductive films are not limited to the two-layer structure, and, for example, a three-layer structure in which a 50 nm thick tungsten film, a 500 nm thick alloy film of aluminum and silicon (Al—Si), and a 30 nm thick titanium nitride film are sequentially stacked may be applied. In the case of the three-layer structure, tungsten nitride may be used as substitute for tungsten of the first conductive film; an alloy film of aluminum and titanium (Al—Ti) may be used as substitute for an alloy film of aluminum and silicon (Al—Si) of the second conductive film; or a titanium film may be used as substitute for a titanium nitride film of a third conductive film. Further, a single layer structure may also be used.

Next, a second photomask made of resist is formed by photolithography, and a first etching treatment is performed to form an electrode and a wiring. The first conductive film and the second conductive film can be etched to a desired tapered shape by appropriately adjusting etching conditions (such as electric energy applied to a coil-shaped electrode, electric energy applied to an electrode on a substrate side, and temperature of the electrode on the substrate side) with the use of ICP (Inductively Coupled Plasma) etching. For an etching gas, a chlorine-based gas typified by $Cl_2$, $BCl_3$, $SiCl_4$, $CCl_4$ and the like; a fluorine-based gas typified by $CF_4$, $SF_6$, $NF_3$ and the like; or $O_2$ can be appropriately used.

A first-shape conductive layer including a first conductive layer and a second conductive layer is formed by the first etching treatment.

Subsequently, a second etching treatment is performed without removing the mask made of resist. Here, a W film is etched selectively. Then, the second conductive layer is formed by the second etching treatment. Meanwhile, the first conductive layer is hardly etched, and a second-shape conductive layer is formed. Thus, conductive films 106 and 107 are formed. In this embodiment, the conductive layers are formed by dry etching; however, wet etching may be applied alternatively.

Next, a resist mask is newly formed by using a third photomask after removing the resist mask. A first doping step is performed to dope an impurity element which imparts n-type conductivity (typically, phosphorus (P) or As) to a semiconductor at low concentrations to form an n-channel TFT not shown herein. The resist mask covers a region which is to serve as a p-channel TFT and a region adjacent to the conductive layer. A low concentration impurity region is formed by this first doping step through the insulating film. Although a plurality of TFTs are used to drive one light emitting element, the above-mentioned doping step is not necessary when the light emitting element is driven by only p-channel TFTs.

Then, a resist mask is newly formed by using a fourth photomask after removing the resist mask. A second doping step is performed to dope an impurity element which imparts p-type conductivity (typically, boron (B)) to a semiconductor at high concentrations. P-type high concentration impurity regions 103 and 104 are formed by performing doping through the gate insulating film 105 by the second doping step.

Then, a resist mask is newly formed by using a fifth photomask. A third doping step is performed to dope an impurity element which imparts n-type conductivity (typically, phosphorus or As) to a semiconductor at high concentrations to form an n-channel TFT not shown herein. The third doping step is performed under the condition that the amount of doze is set at from $1\times10^{13}$ atoms/cm$^2$ to $5\times10^{15}$ atoms/cm$^2$; and the acceleration voltage, from 60 keV to 100 keV. The resist mask covers a region which serves as a p-channel TFT and a region adjacent to the conductive layer. An n-type high concentration impurity region is formed by performing doping through the gate insulating film 105 by the third doping step.

Through the above steps, an impurity regions are formed in each semiconductor layer.

Next, the mask made of resist is removed, and an insulating film 108 containing hydrogen is formed as a passivation film. The insulating film 108 is formed with an insulating film containing silicon to a thickness from 100 nm to 200 nm by plasma CVD or sputtering. The insulating film 108 is not limited to a silicon nitride film, and a silicon nitride oxide (SiNO) film by plasma CVD, or a single layer or a stack of other insulating films containing silicon may be used.

Moreover, the step for hydrogenating the semiconductor layers is performed by heat treatment at a temperature of 300° C. to 550° C. for 1 hour to 12 hours under a nitrogen atmosphere. The step is preferably performed at a temperature of 400° C. to 500° C. The step is a step for terminating dangling bonds of the semiconductor layers due to hydrogen contained in the insulating film 108.

The insulating film 108 is formed of a material selected from silicon nitride, silicon oxide, silicon oxynitride (SiON), silicon nitride oxide (SiNO), aluminum nitride (AlN), aluminum oxynitride (AlON), aluminum nitride oxide having more nitrogen content than oxygen content (AlNO), aluminum oxide, diamond like carbon (DLC), and a nitrogen-containing carbon film (CN) film. Alternatively, a material in which a skeletal structure is constructed by allowing silicon (Si) and oxygen (O) to bond with each other, and a substituent contains at least hydrogen, or at least one of fluorine, an alkyl group, and aromatic hydrocarbon (typically, a siloxane polymer) may be used.

In the invention, a silicon oxynitride (SiON) film denotes a film containing Si of 25 atom % to 35 atom %, oxygen of 55 atom % to 65 atom %, nitrogen of 1 atom % to 20 atom %, and hydrogen of 0.1 atom % to 10 atom %. Meanwhile, a silicon nitride oxide (SiNO) film denotes a film containing Si of 25 atom % to 35 atom %, oxygen of 15 atom % to 30 atom %, nitrogen of 20 atom % to 35 atom %, and hydrogen of 15 atom % to 25 atom %.

In order to activate the impurity element, heat-treatment, irradiation with intense light, or irradiation with a laser beam may be carried out. Simultaneously with the activation, plasma damage in the gate insulating film or plasma damage at an interface between the gate insulating film and the semiconductor layer can be repaired.

A heat-resistant planarizing film 109, which serves as an interlayer insulating film, is formed. The heat-resistant planarizing film 109 is formed of an insulating film having a skeletal structure composed of a bond of silicon (Si) and oxygen (O), which is obtained by the coating method.

The procedure for forming the heat-resistant planarizing film 109 will be described in more detail below with reference to FIGS. 3A to 3C and FIG. 4.

The substrate to be processed is washed with pure water. Alternatively, megasonic cleaning may be performed. After baking the substrate for dehydrogenation at 140° C. for 110 seconds, the substrate is cooled with a water-cooling plate for 120 seconds to stabilize the temperature of the substrate. Then the substrate is transferred into a spin-coating device as shown in FIG. 3A.

Figure 3A:
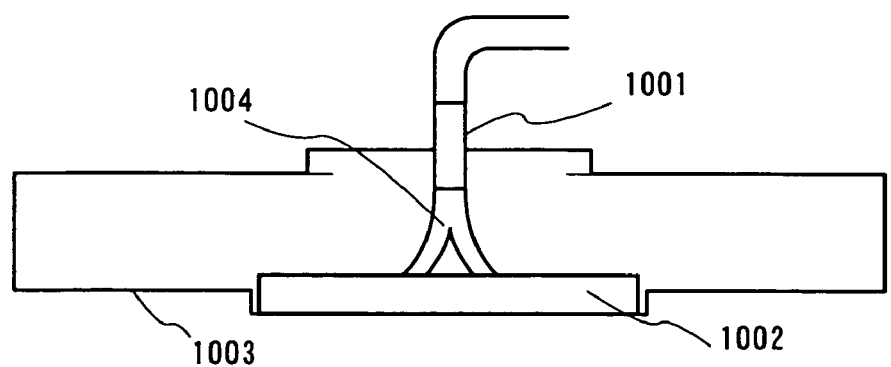
FIGS. 3A to 3C are figures showing a spin-coating device and edge removers.

FIG. 3A is a cross sectional view of the spin-coating device. In FIG. 3A, reference numeral 1001 denotes a nozzle; 1002 denotes a substrate; 1003 denotes a coating cup; and 1004 denotes a liquid coating material. The liquid coating material is discharged from the nozzle 1001. The substrate 1002 is horizontally accommodated in the coating cup 1003, and the entire coating cup rotates. Further, the pressure of the atmosphere in the coating cup 1003 can be controlled.

In order to improve wettability, pre-wet application is performed to improve wettability with the use of an organic solvent such as thinner (a volatile mixture solvent formed by mixing aromatic hydrocarbon (toluene or the like), alcohols, ester acetate or the like). 70 ml thinner is dropped while spinning the substrate (rotation rate: 100 rpm) to spread the thinner on the entire surface of the substrate by the centrifugal force. Subsequently, the substrate is spun at high speed (rotation rate: 450 rpm) to remove the excess thinner.

Next, a liquid coating material using a liquid raw material in which siloxane polymer is dissolved in a solvent (propylene glycol monomethyl ether) is dropped from the nozzle 1001 while spinning the substrate gradually (the rotation rate is increased from 0 rpm to 1,000 rpm) so as to spread the liquid coating material on the entire surface of the substrate by centrifugal force. The siloxane polymer can be classified into, for example, silica glass; alkylsiloxane polymer; alkylsilsesquioxane polymer; silsesquioxane hydride polymer; alkylsilsesquioxane hydride polymer; and the like in accordance with the structure of siloxane. As examples of the siloxane polymer, there are a coating material for an insulating film such as #PSB-K1 and #PSB-K31 manufactured by Toray Industries, Inc., and a coating material for an insulating film such as #ZRS-5PH manufactured by Catalysts & Chemicals Industries. Co., Ltd. Then, the substrate is gradually spun (rotation rate from 0 rpm to 1400 rpm) after holding the substrate for 30 seconds for leveling a film formed by the coating step.

The interior of the coating cup 1003 is evacuated to reduce a pressure, and the coating film is then vacuum-dried within one minute.

Figure 3B:
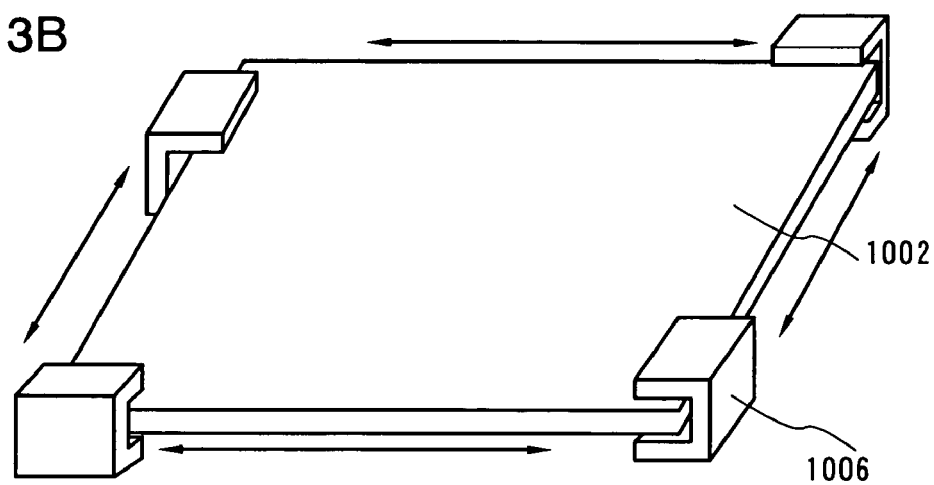
Figure 3C:
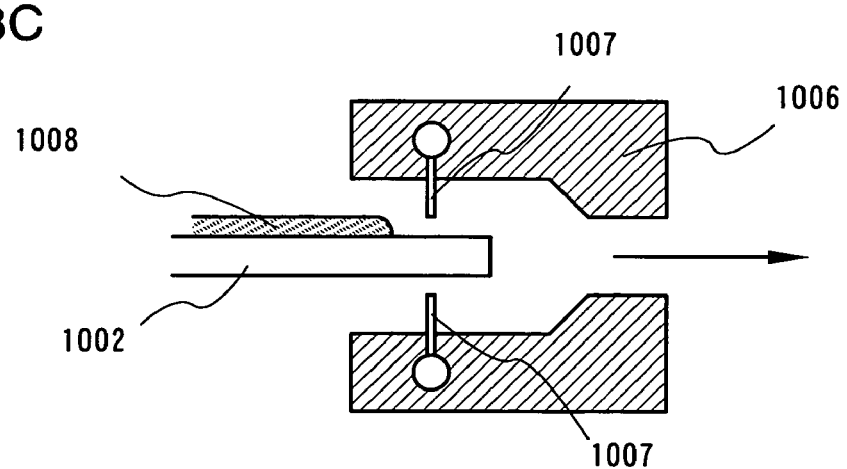

Subsequently, an end portion of the coating film is removed by using an edge remover provided in the spin-coating device shown in FIG. 3A. FIG. 3B shows an edge remover 1006 having a driving means for moving the edge remover in parallel around the substrate 1002. The edge remover 1006 is equipped with thinner discharge nozzles 1007 as depicted in FIG. 3C so as to sandwich one side of the substrate. The peripheral portion of the film formed by the coating step 1008 is melted with the thinner discharged from the thinner discharge nozzles 1007. A liquid and gas are discharged in the direction of an arrow in the drawings to remove the film formed by the coating step in the peripheral portion of the substrate.

The resultant substrate is then preliminarily baked at 110° C. for 170 seconds.

After the substrate is carried out of the spin-coating device and cooled, the substrate is further baked at 270° C. for one hour. Thus, the heat-resistant planarizing film 109 with a thickness of 0.8 μm is formed. When the smoothness of the thus obtained heat-resistant planarizing film 109 is measured with an AFM (atomic force microscope), the P-V value (peak-to valley, which is a difference in height between the maximum value and the minimum value) is about 5 nm, and the Ra (average surface roughness) value is about 0.3 nm.

Figure 12:
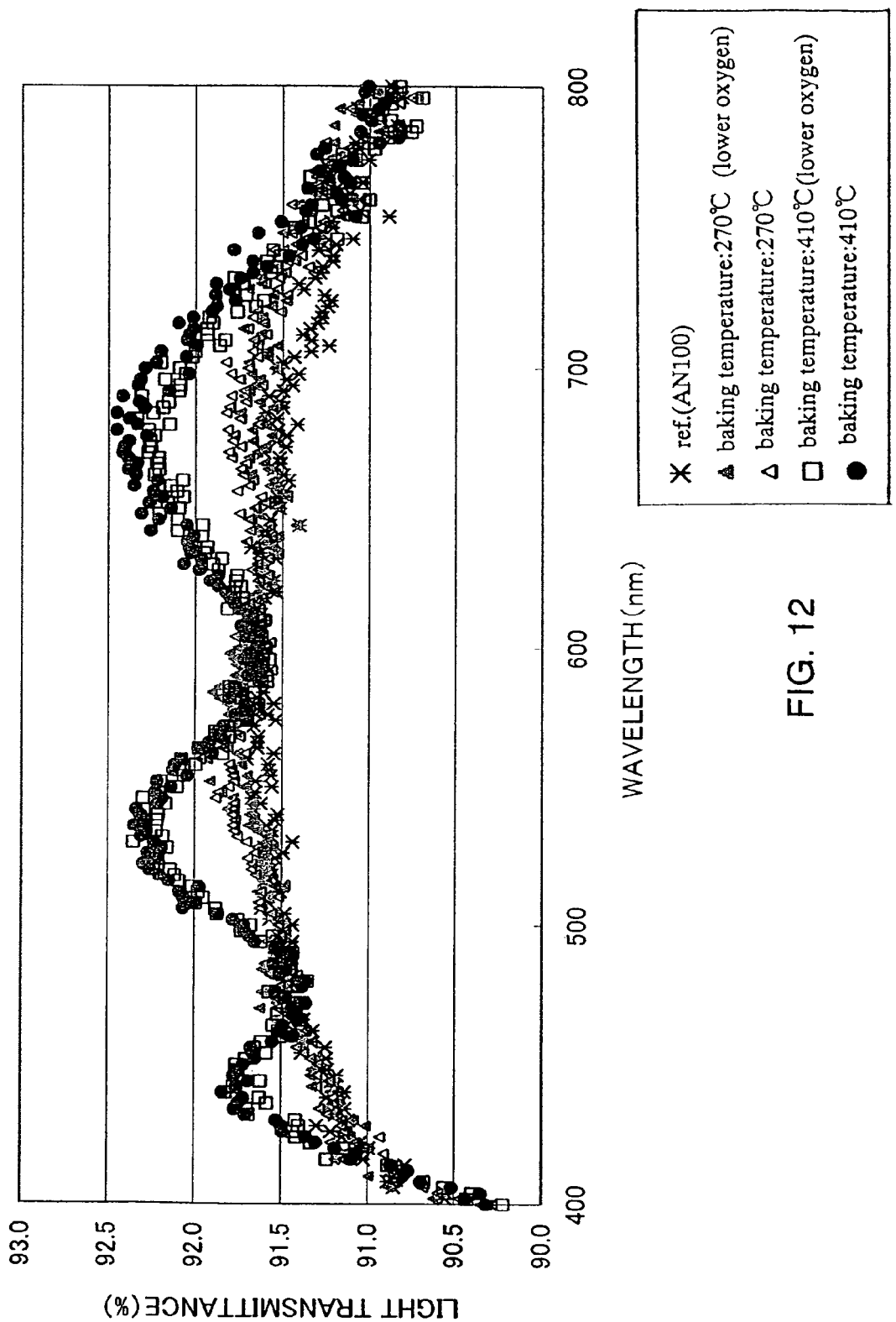
FIG. 12 is a graph showing a light transmittance.
Figure 13:
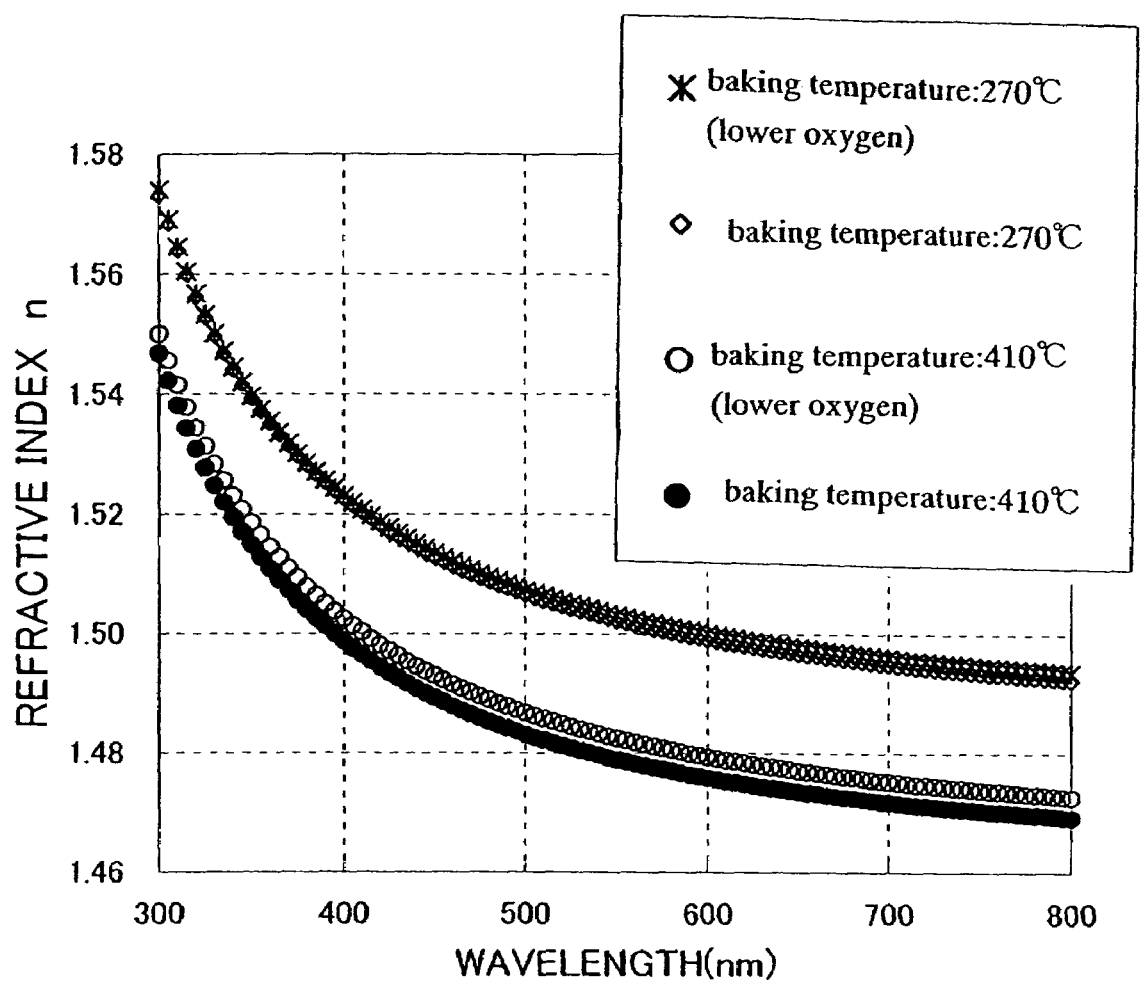
FIG. 13 is a graph showing refractive index.

By varying the baking temperatures of the heat-resistant planarizing film 109, the light transmittance can be changed. FIG. 12 shows the light transmittance of the heat-resistant planarizing film (a SiOx film containing an alkyl group) with a thickness of 0.8 μm under the different baking temperatures (270° C. and 410° C.). FIG. 13 shows the refractive index thereof under the same conditions. When the baking temperature is set at 410° C., the light transmittance of the heat-resistant planarizing film is increased as compared with the case of 270° C. Furthermore, when the baking temperature is set at 410° C., the refractive index is decreased.

Figure 4:
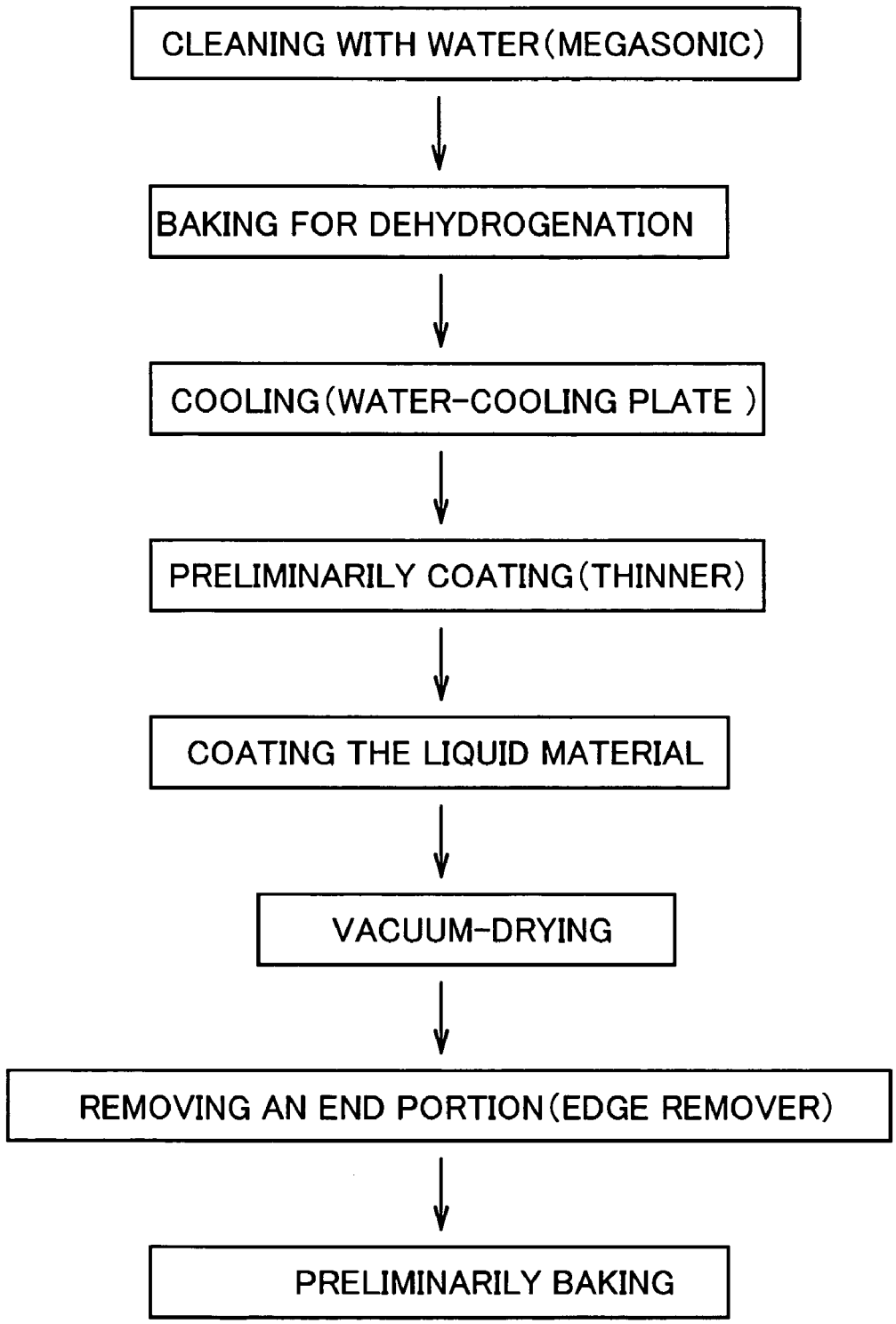
FIG. 4 is a flow chart a film formation of a heat-resistant planarizing film.

The flow of the above steps are shown in FIG. 4

Thus, the heat-resistant planarizing film 109 is formed (FIG. 1A).

Further, the heat-resistant planarizing film 109 may be formed by a liquid discharge method (ink jet method). In the case of the liquid discharge method (ink jet method), the liquid material can be saved.

An inorganic material (silicon oxide, silicon nitride, silicon oxynitride, silicon nitride oxide), a film containing one or more of photosensitive or non-photosensitive organic materials (an organic resin material) (polyimide, acrylic, polyamide, polyimide-amide, benzocyclobutene, and a resist material), or a laminate of the films containing the above materials can be used for the heat-resistant planarizing film 109 as long as the material has high heat resistance and preferable flatness other than the insulating film in which a skeletal structure is composed of a bond of silicon (Si) and oxygen (O).

Figure 1B:
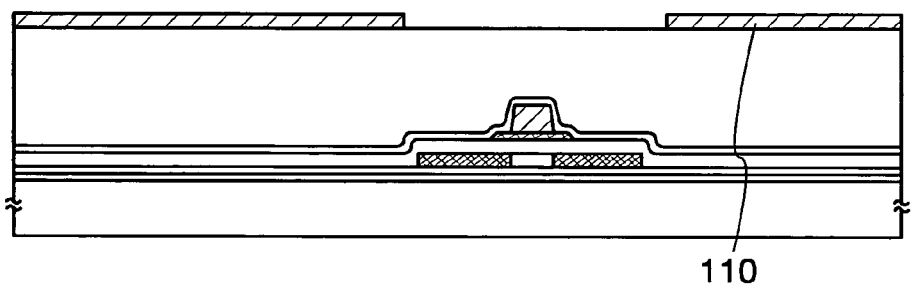

Next, a pixel electrode (first electrode) 110 is formed on the heat-resistant planarizing film 109. In this embodiment mode, a transparent conductive film is formed and etched to the desired shape so as to form the pixel electrode 110 (FIG. 1B). For the pixel electrode 110, a transparent conductive film in which indium oxide is mixed with zinc oxide (ZnO) of 2% to 20% may be used as well as ITO, IZO, or ITSO. Alternatively, a titanium nitride film or a titanium film may also be used for the pixel electrode 110. In this case, after forming a transparent conductive film, a titanium nitride film or a titanium film is formed so as to be thin enough to transmit light (preferably, about 5 to 30 nm). In this embodiment mode, ITSO is used for the pixel electrode 110. The pixel electrode 110 may be polished by CMP or by cleaning with porous body of polyvinyl alcohols so that the surface thereof is made flat. Further, the surface of the pixel electrode 110 may be processed with oxygen plasma or exposed to ultraviolet irradiation after the polishing by CMP. In the invention, the pixel electrode 110 that is a first electrode is formed on the heat-resistant planarizing film, so that there are no irregularities and steps on the surface; therefore, the surface of the pixel electrode can be polished fully and easily.

Subsequently, with the use of a mask made of resist, the heat-resistant planarizing film 109 at an end portion is removed concurrently with the formation of a contact hole 111(opening portion) which is formed in the heat-resistant planarizing film 109. Etching (wet etching or dry etching) is performed under the condition in which a desirable selective ratio can be obtained with respect to the insulating film. In this embodiment mode, an inert gas is added to an etching gas to be used. One or more selected from He, Ne, Ar, Kr, and Xe are used as the inert element to be added. Above all, it is preferable to use argon since it has comparatively large atomic radius and is inexpensive. In this embodiment mode, $CF_4$, $O_2$, He, and Ar are used. Dry etching is performed under the conditions of the $CF_4$ flow rate of 380 sccm; the $O_2$ flow rate of 290 sccm; the He flow rate of 500 sccm; the Ar flow rate of 500 sccm; the RF power of 3,000W; and a pressure of 25 Pa. Etching residue can be reduced by the above conditions.

In order to etch without leaving residue on the gate insulating film 105, it is preferable that etching time be increased by 10% to 20%. One time etching or plural times of etching may be conducted to obtain a tapered shape. Here, the tapered shape is obtained by performing the second dry etching with the use of $CF_4$, $O_2$, and He by setting the flow of $CF_4$ at 550 sccm; $O_2$, 450 sccm; He, 350 sccm; RF power, 3000W; and a pressure, 25 Pa. The taper angle θ of the sides for the heat-resistant planarizing film is desirably set at not less than 30° and not more than 75°.

Next, an inert element may be doped to an end portion of the heat-resistant planarizing film to form a highly densified part on the tapered portion of the heat-resistant planarizing film. The doping may be performed by ion doping or ion implantation. Typically, argon (Ar) is used as the inert element. Distortion is given by adding the inert element with a comparatively large atomic radius to modify a surface (including a side surface) or to highly densify for preventing the intrusion of moisture or oxygen. The inert element contained in the highly densified part is set within the concentration range from $1 \times 10^{19}$ atoms/cm$^3$ to $5 \times 10^{21}$ atoms/cm$^3$, typically, from $2\times10^{19}$ atoms/cm$^3$ to $2\times10^{21}$ atoms/cm$^3$. In addition, when an end portion of the heat resistant planarizing film is formed to have a tapered shape, the side surface is easily doped.

Figure 1C:
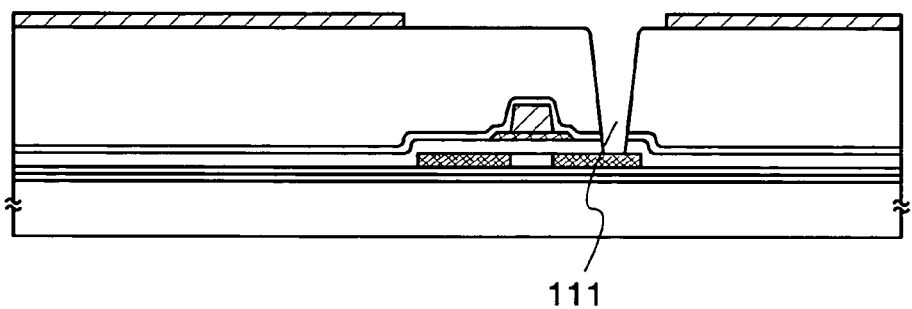

The gate insulating film 105 is etched to form an opening reaching the source region and the drain region. The opening is formed by etching the insulating film 108 and the gate insulating film 105 by forming a new mask, or using the etched heat-resistant planarizing film 109 as a mask after etching the heat-resistant planarizing film 109. The gate insulating film 105 is etched by using CHF$_3$ and Ar as an etching gas. Through the etching according to the above conditions, etching residue is reduced, and a flat contact hole with few irregularities can be formed. Note that the etching time is preferably increased by 10% to 20% for etching without leaving residue over the semiconductor layer. Thus, a contact hole 111 is formed (FIG. 1C).

Figure 17A:
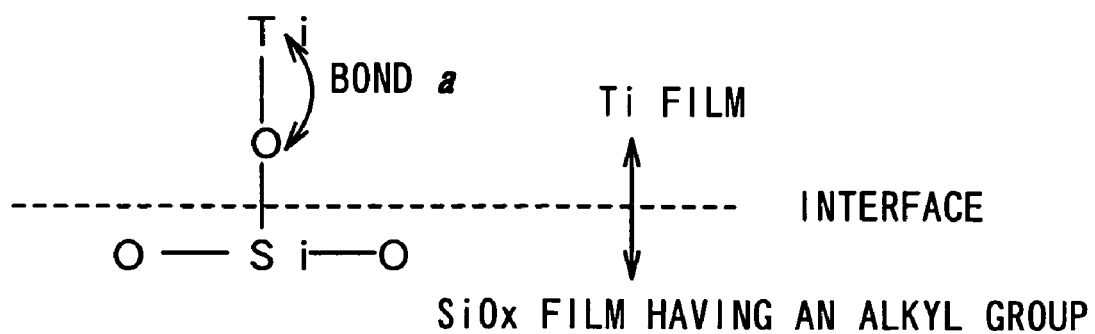
FIGS. 17A and 17B is a coupling model in lamination of film.
Figure 17B:
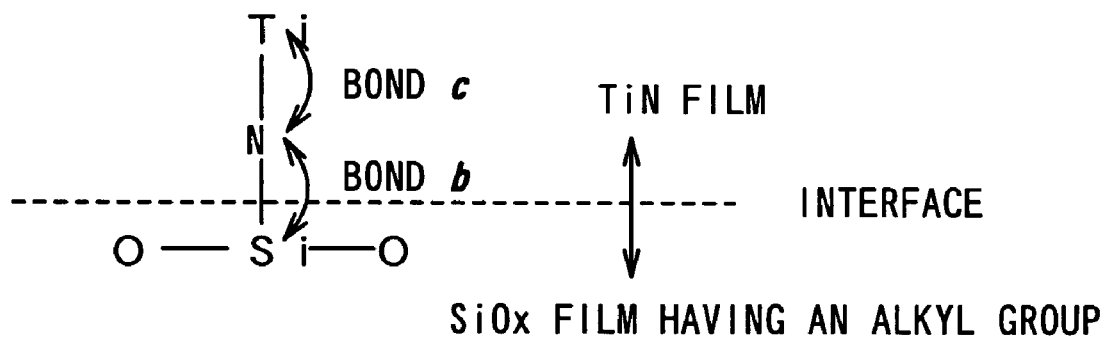

A metal film is formed and etched to form a wiring 112 which is electrically connected to respective impurity regions. The metal film may be a film formed of an element selected from aluminum (Al), titanium (Ti), molybdenum (Mo), tungsten (W), and silicon (Si), or an alloy film using the above elements. In this embodiment mode, TiN/Al/TiN are each stacked to be 100 nm/350 nm/100 nm, and thereafter patterned to the desired shape to form the wiring. TiN is one of the materials which have good adhesion with the heat-resistant planarizing film. FIG. 17A shows an example of a stack model of a film of silicon oxide (SiOx) having an alkyl group and a Ti film. FIG. 17B shows an example of a stack model of a film of silicon oxide (SiOx) having an alkyl group and a TiN film. When a film of silicon oxide (SiOx) having an alkyl group is used for the heat-resistant planarizing film and Ti is formed thereon as a wiring, a bond of Si—O—Ti is formed at the interface, and a bond a of O—Ti is formed. On the other hand, when TiN is stacked as a wiring on the heat-resistant planarizing film, a bond of Si—N—Ti is formed at the interface, and a bond b of Si—N and a bond c of N—Ti are formed at the interface. O—Ti of the bond a has low binding force, thus, adhesion is also weak. In contrast, the binding force of the bond b of Si—N and the bond c of N—Ti are strong; thus, the adhesion is strong and the film separation such as peel-off can be reduced. In addition, the content of N in TiN is preferably less than 44 atomic % to obtain a contact with the source region or the drain region of a TFT. More preferably, the content of N in TiN is more than 7 atomic % and less than 44 atomic %. Further, a two-layer structure having conductive films of TiN/Al may be used to simplify the steps.

Figure 1D:
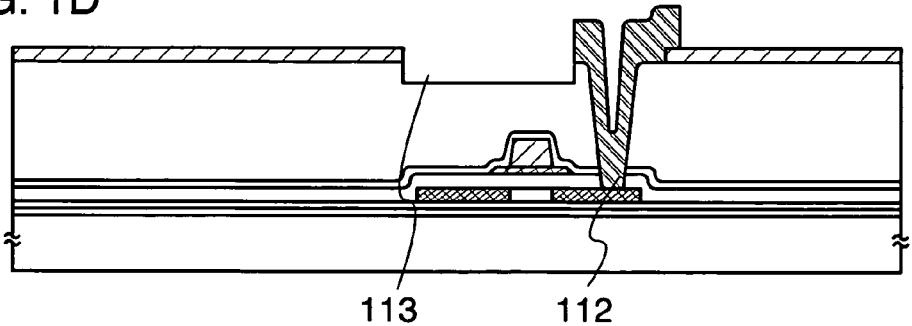

Etching is performed by ICP (inductively coupled plasma) etching using BCl$_3$ and Cl$_2$. The etching condition is as below: the power applied to a coiled electrode is 450 W and the power applied to an electrode on the substrate side is 100 W, and under a pressure of 1.9 Pa. Hereupon, the pixel electrode 110 which is formed in advance serves as an etching stopper. The difference between the selectivity of the wiring 112 to the pixel electrode 110 and the selectivity of the wiring 112 to the heat-resistant planarizing film 109 makes the heat-resistant planarizing film 109 having lower selectivity etched, so that a depression 113 is formed (FIG. 1D).

Figure 2A:
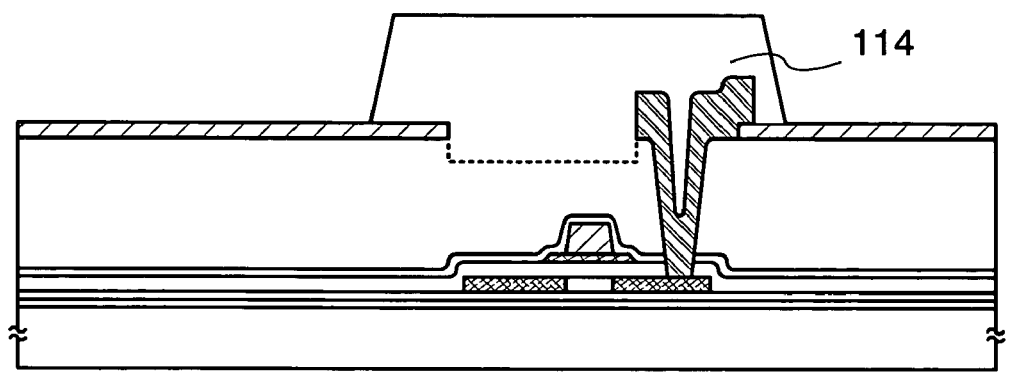
FIGS. 2A and 2B are figures showing a structure according to the invention.

Subsequently, an insulator 114 (also referred to as a bank, a partition wall, a barrier, and the like) which covers the depression 113, an end portion of the pixel electrode 110 and the wiring 112 is formed (FIG. 2A). As the insulator 114, a SOG film (such as a SiOx film having an alkyl group) with a film thickness of 0.8 μm to 1.0 μm is formed by a coating method. The insulator 114 may be either dry etched or wet etched. Here, the insulating film 114 is formed by dry etching using a mixture gas of CF$_4$, O$_2$, and He, on the condition that 25 sccm CF$_4$, 25 sccm O$_2$, and 50 sccm He, at a pressure of 5 Pa at 1500W. In the dry etching, the etching rate of the SiOx film containing an alkyl group is 500 nm/min to 600 nm/min, whereas the etching rate of the ITSO film is 10 nm/min or less. Accordingly, favorable etching ratio can be obtained. Since the wiring 112 is covered with the insulator 114 formed with a SiOx film having an alkyl group, the TiN film which has high adhesion is provided as the outermost layer. In the invention, the pixel electrode 110 is used as the etching stopper for forming the wiring. Therefore, the process is simplified. Further, the depression formed in the heat-resistant planarizing film 109 does not matter since the depression is filled by the insulator 114. An inorganic material (silicon oxide, silicon nitride, silicon oxynitride, silicon nitride oxide), a film containing a kind of or a mixture of photosensitive or non-photosensitive organic materials (an organic resin material) (polyimide, acrylic, polyamide, polyimide-amide, benzocyclobutene, and a resist material), or a stack of films contain the above materials can be used for the insulator 114 as long as the material has high heat resistance and preferable flatness other than the insulating film in which a skeletal structure is composed of a bond of silicon (Si) and oxygen (O).

According to the above-described steps, an active matrix substrate including a TFT is completed. In this embodiment, the active matrix substrate has a double gate structure in which two channel regions are formed in the n-channel TFT of the pixel area. Furthermore, the active matrix substrate may have a single gate structure having one channel region or a triple gate structure having three channel regions. Although a TFT for the driver circuit area has a single gate structure in this embodiment, the TFT may have a double gate structure or a triple gate structure.

Not limited to the method for manufacturing a TFT described in this embodiment, the present invention can be applied to a top gate type (planar type), a bottom gate type (inverted staggered type), or a dual gate type having two gate electrodes disposed above and below a channel region while interposing a gate insulating film therebetween.

A light emitting layer 115 which is a layer containing an organic compound is next formed. In order to improve the reliability, a vacuum heating is preferably carried out to perform degassing before forming the light emitting layer 115. In order to remove gases contained in the substrate, for example, it is desirable that heat treatment be performed at a temperature of 200° C. to 300° C. under a reduced pressure atmosphere or an inert atmosphere before deposition of an organic compound material. Since the interlayer insulating film and the partition wall are formed with the heat-resistant SiOx films, a problem is not caused even if the heat treatment is performed at a high temperature. Accordingly, a step for improving reliability by heat treatment can be fully performed.

Figure 2B:
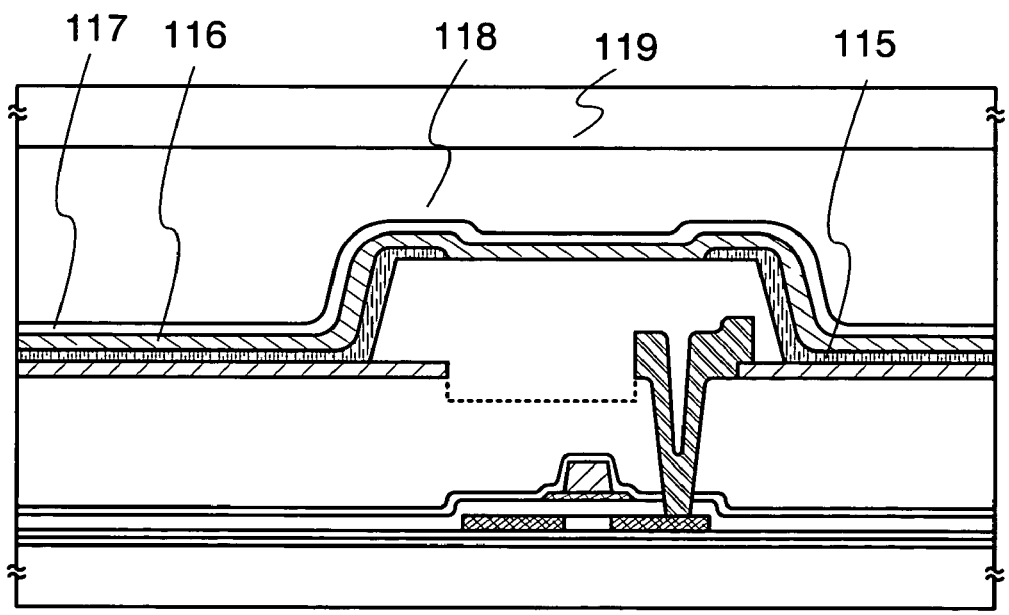

The light emitting layer 115 is formed on the pixel electrode 110 (FIG. 2B). Only one pixel is shown in FIG. 2B. However, light emitting layers corresponding to respective colors of R (red), G (green), and B (blue) are separately formed in this embodiment mode. The respective light emission can all be luminescence obtained when a singlet excited state returns back to a ground state (fluorescence) or luminescence obtained when a triplet excited state returns to a ground state (phosphorescence). Combination of one color of fluorescence (phosphorescence), and two colors of phosphorescence (fluorescence) can also be used. Further, phosphorescence may be used for only R and fluorescence may be used for G and B. Specifically, an EL layer may have a laminated structure having a copper phthalocyanine (CuPc) film provided with a thickness of 20 nm as the hole injecting layer and a tris-8-quinolinolato aluminum complex ($Alq_3$) film provided thereover with a thickness of 70 nm as the light emitting layer. Colors of light emission can be controlled by adding fluorescent dye such as quinacridone, perylene, or DCM 1 to $Alq_3$.

However, the foregoing example is an example of the organic light-emitting material, which can be used as the light emitting layer, and the organic light-emitting material is not necessarily limited thereto. The light emitting layer (layer for light emission and for carrier movement for the light emission) may be formed by freely combining the light emitting layer, the charge transport layer, or the charge injection layer. Although the example in which the low molecular weight organic light-emitting material is used as the light emitting layer is described in this embodiment mode, for example, an intermediate molecular weight organic light-emitting material or a high molecular weight organic light-emitting material may be used instead. Throughout this specification, an organic light-emitting material which does not sublimate and a number of molecules of 20 or less or having a chained molecule length of 10 μm or less is defined as the intermediate molecular weight organic light-emitting material. In addition, as an example of using a high molecular weight organic light-emitting material, a layered structure having a polythiophene (PEDOT) film provided by spin coating with a thickness of 20 nm as the hole injection layer and a paraphenylene-vinylene (PPV) film with a thickness of approximately 100 nm provided thereover as the light emitting layer may be given. In addition, emission wavelength can be selected from red through blue by using π-conjugated polymer of PPV. An inorganic material such as silicon carbide can be used for the charge transport layer or the charge injection layer. The organic light-emitting materials and inorganic materials can use known materials.

Next, an electrode 116 formed with a conductive film is provided on the light emitting layer 115. The electrode 116 may be made of a material having lower work function (for example, Al, Ag, Li, and Ca, or alloy of these elements such as MgAg, MgIn, AlLi, $CaF_2$, or CaN). In this embodiment mode, the electrode 116 serves as a cathode, and light is released from the side of the pixel electrode which serves as an anode. Therefore, it is preferable to use a metal film (with a thickness from 50 nm to 200 nm) formed of Al, Ag, Li, or Ca, or alloy of those elements such as MgAg, MgIn, AlLi for the electrode 116. Note that, the invention is not limited to such a structure. Alternatively, the TFT of the pixel area may be an n-channel TFT, the pixel electrode may serve as a cathode, and the electrode 116 may serve as an anode.

It is effective to provide a passivation film 117 so as to cover the electrode 116. The passivation film is made of an insulating film containing an element selected from: silicon nitride; silicon oxide; silicon oxynitride (SiON); silicon nitride oxide (SiNO); aluminum nitride (AlN); aluminum oxynitride (AlON); aluminum nitride oxide (AlNO) containing more nitrogen content than oxygen content; aluminum oxide; diamond like carbon (DLC); or a nitrogen-containing carbon film (CN). The passivation film may be a single-layer insulating film or a stack thereof. Alternatively, a material in which a skeletal structure is constructed by allowing silicon (Si) and oxygen (O) to bond with each other, and a substituent contains at least hydrogen, or at least one of fluorine, an alkyl group, and aromatic hydrocarbon (typically, a siloxane polymer) may be used.

In such a case, a film having good coverage is preferably used as the passivation film. It is effective to use a carbon film, particularly a DLC film. Since the DLC film can be formed at temperatures ranging from room temperature to 100° C., the DLC film can be easily formed above the light emitting layer 115 having low heat resistance. The DLC film can be formed by plasma CVD (typically, RF plasma CVD, microwave CVD, electron cyclotron resonance (ECR) CVD, hot-filament CVD, or the like), a combustion flame method, sputtering, ion-beam deposition, laser deposition, and the like. Reaction gases used in the film formation are a hydrogen gas and a hydrocarbonic gas (for example, $CH_4$, $C_2H_2$, $C_6H_6$, and the like). The reactive gases are ionized by glow discharge, and resultant ions are accelerated and collided to the cathode which is negatively self-biased to form a film. A CN film may be formed by using $C_2H_4$ gas and $N_2$ gas as the reactive gas. The DLC film has a high blocking effect to oxygen and can suppress oxidization of the light emitting layer 115. Consequently, a problem of oxidation of the light emitting layer 115 during the following sealing step can be avoided.

Next, a sealing substrate 119 is pasted with a sealant to encapsulate the light emitting element. The encapsulation is performed as an end portion of the heat-resistant planarizing film is covered with the sealant. The deterioration of the light emitting element can be prevented since the penetration of moisture through the cross section can be prevented with the use of the sealant; thus, the reliability of the light emitting display device can be improved. The area surrounded by the sealant is filled with a filler 118. In this embodiment mode, the filler is not required to transmit light since the light is released through the pixel electrode 110; meanwhile, in the case of a structure where the light is released through the filler 118, it is required to transmit light. Typically, UV/visible light curable or thermosetting epoxy resin may be used. A high heat-resistant UV ray curable epoxy resin (#2500 Clear, manufactured by Electro-Lite Corporation) having the refractive index of 1.50; the viscosity of 500 cps; a Shore D hardness of 90; tensile strength of 3,000 psi; the Tg point of 150° C.; the volume resistance of $1 \times 10^{15}$ Ω·cm; and a withstand voltage of 450 V/mil is used here. The total light transmittance can be improved by filling the filler 118 between the pair of substrates.

Figure 15A:
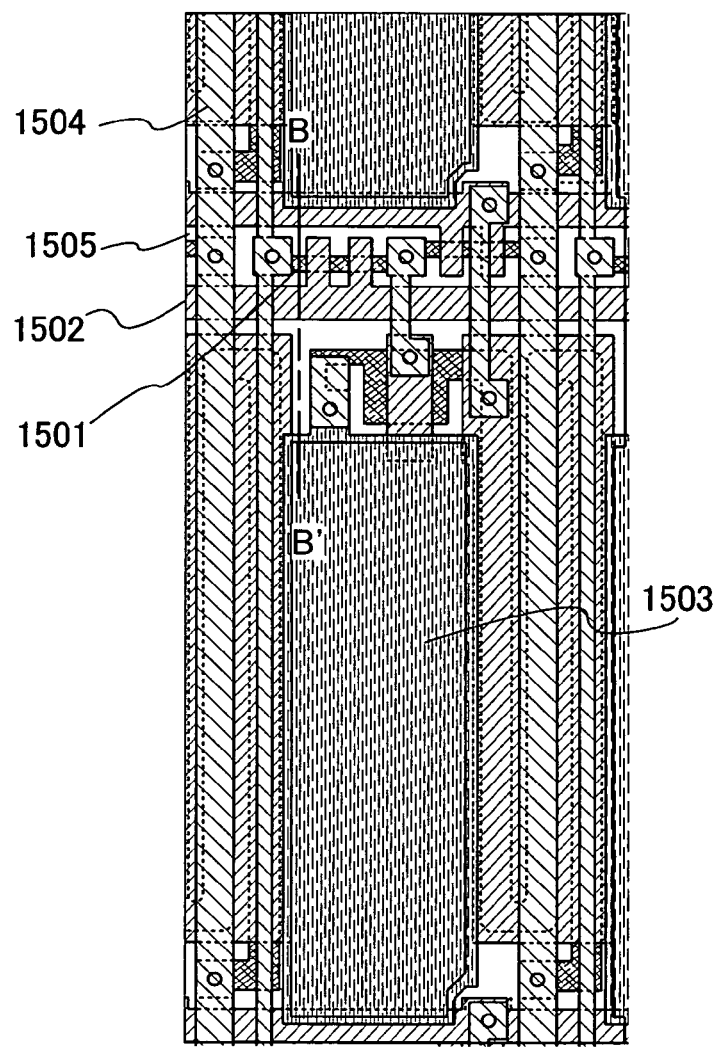
FIGS. 15A and 15B respectively show a top view and a cross-sectional view of a display device according to the invention.
Figure 15B:
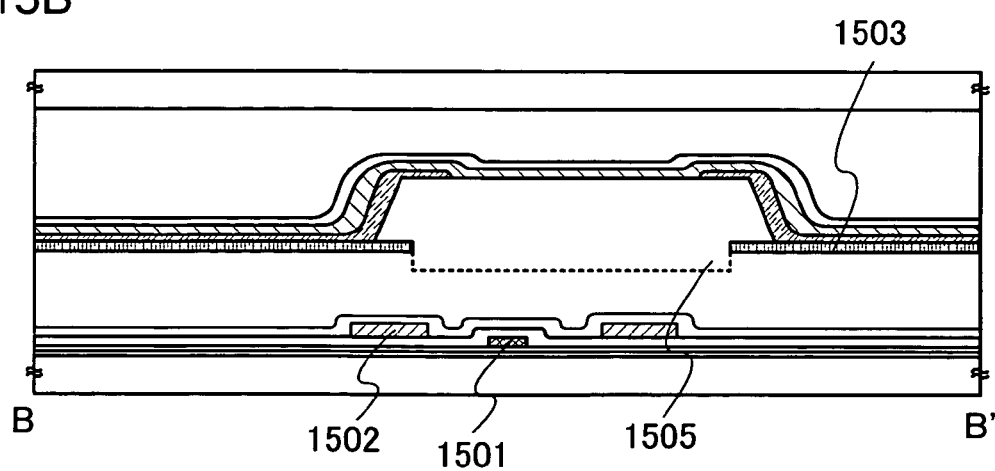

A top view of a pixel area of a light emitting device according to this embodiment is shown in FIG. 15A. FIG. 15B shows a cross sectional view along line B-B' of FIG. 15A. Reference numeral 1501 denotes a semiconductor film, 1502 denotes a gate line (scan line), 1503 denotes a pixel electrode, 1504 denotes a source line (signal line), and 1505 denotes a partition wall. The source line is patterned using a conductive film that is to be the pixel electrode as an etching stopper. Accordingly, the heat-resistant planarizing film where either the source line or the pixel electrode is not provided is partially etched so that a depression is formed therein. The partition wall is formed so as to cover the depression.

Thus manufactured active matrix light emitting display device includes the heat-resistant planarizing film 109 as interlayer insulating film of a TFT. The heat-resistant planarizing film 109 is formed of a material typically having a skeletal structure composed of a bond of silicon (Si) and oxygen (O). The partition wall also uses the same material. Relatively stable materials containing silicon oxide are employed for the constituent materials of the active matrix light emitting device, thereby improving the reliability of the light emitting device. Further, the pixel electrode 110 is used as an etching stopper; accordingly, the process can be simplified, and a display device can be manufactured with higher yield and at lower cost.

Embodiment 1

In this embodiment, a manufacturing method of the display device described in Embodiment Mode will be explained with reference to FIGS. 1A to 1D and FIG. 14.

A 50-nm-thick a silicon nitride oxide film and a 100-nm-thick a silicon oxynitride film are formed over a substrate 100 as a base film 101 by plasma CVD.

Next, a semiconductor film is formed on the base film. In this embodiment, an amorphous silicon film is formed to a thickness of 54 nm by plasma CVD. In this embodiment, thermal crystallization or laser crystallization method using a metal element which promotes crystallization is performed to the amorphous silicon film.

Nickel is used as the metal element, and is doped into the amorphous silicon film by solution coating. A method for doing the metal element into the amorphous silicon film, a method using a solution is simple and easily performed, and is useful for easily adjusting concentration of the metal element. At this time, an oxide film is preferably formed by ultraviolet (UV) ray irradiation under an oxygen atmosphere, thermal oxidation, treatment with ozone water or hydrogen peroxide including hydroxyl radical, and the like in order to improve wettability of the surface of an amorphous semiconductor film and to spread aqueous solution over the entire surface of the amorphous silicon film.

In this embodiment, after forming a metal-containing layer by solution coating with the use of nickel as the metal element, the metal-containing layer is introduced on the amorphous silicon film, and heat treatment is performed thereto at a temperature of 550° C. for four hours, thereby obtaining a first crystalline silicon film.

Next, the first crystalline silicon film is irradiated with a laser beam to promote crystallization, and thus, a second crystalline silicon film is obtained. Laser crystallization is performed by irradiating the semiconductor film with a laser beam. A pulsed or continuous oscillation solid-state laser, a gas laser, or a metal laser is preferable to be used for the laser crystallization. The solid-state laser includes: YAG laser, $YVO_4$ laser, YLF laser, $YAlO_3$ laser, glass laser, ruby laser, alexandrite laser, Ti:sapphire laser, and the like. The gas laser includes: excimer laser, Ar laser, Kr laser, $CO_2$ laser, and the like. The metal laser includes helium cadmium laser.

The thus obtained crystalline semiconductor film is doped with a minute amount of impurity elements (boron or phosphorous) so as to control the threshold voltage of the TFT.

A first photomask is formed and patterned by photolithography so as to form a semiconductor layer 102.

A gate insulating film 105 covering the semiconductor layer 102 is formed. In this embodiment, a silicon oxynitride film is formed to have a thickness of 115 nm by plasma CVD.

Subsequently, a first conductive film is formed on the gate insulating film to a thickness of 20 nm to 100 nm, and a second conductive film is formed thereover to a thickness of 100 nm to 400 nm, so as to form a gate electrode. In this embodiment, a 30-nm-thick tantalum nitride film is formed on the gate insulating film as the first conductive film, and a 370-nm-thick tungsten film is formed thereover as the second conductive film.

Next, a second photomask made of resist is formed by photolithography, and a first etching treatment is performed to form an electrode and a wiring. The first conductive film and the second conductive film can be etched to a desired tapered shape by appropriately adjusting etching conditions (such as electric energy applied to a coil-shaped electrode, electric energy applied to an electrode on a substrate side, and temperature of the electrode on the substrate side) with the use of ICP (Inductively Coupled Plasma) etching. For an etching gas, a chlorine-based gas typified by $Cl_2$, $BCl_3$, $SiCl_4$, $CCl_4$ and the like; a fluorine-based gas typified by $CF_4$, $SF_6$, $NF_3$ and the like; or $O_2$ can be appropriately used.

A first-shape conductive layer including a first conductive layer and a second conductive layer is formed by the first etching treatment.

Subsequently, a second etching treatment is performed without removing the mask made of resist. Here, a W film is etched selectively. Then, the second conductive layer is formed by the second etching treatment. Meanwhile, the first conductive layer is hardly etched, and a second-shape conductive layer is formed. Thus, conductive films 106 and 107 are formed. In this embodiment, the conductive layers are formed by dry etching.

Next, a resist mask is newly formed by using a third photomask after removing the resist mask. A first doping step is performed to dope an impurity element which imparts n-type conductivity (typically, phosphorus (P) or As) to a semiconductor at low concentrations to form an n-channel TFT not shown herein. The resist mask covers a region which is to serve as a p-channel TFT and a region adjacent to the conductive layer. A low concentration impurity region is formed by this first doping step through the insulating film. Although a plurality of TFTs are used to drive one light emitting element, the above-mentioned doping step is not necessary when the light emitting element is driven by only p-channel TFTs.

Then, a resist mask is newly formed by using a fourth photomask after removing the resist mask. A second doping step is performed to dope an impurity element which imparts p-type conductivity (typically, boron (B)) to a semiconductor at high concentrations. P-type high concentration impurity regions 103 and 104 are formed by performing doping through the gate insulating film 105 by the second doping step.

Then, a resist mask is newly formed by using a fifth photomask. A third doping step is performed to dope an impurity element which imparts n-type conductivity (typically, phosphorus or As) to a semiconductor at high concentrations to form an n-channel TFT not shown herein. The third doping step is performed under the condition that the amount of doze is set at from $1 \times 10^{13}$ atoms/cm$^2$ to $5 \times 10^{15}$ atoms/cm$^2$; and the acceleration voltage, from 60 keV to 100 keV. The resist mask covers a region which serves as a p-channel TFT and a region adjacent to the conductive layer. An n-type high concentration impurity region is formed by performing doping through the gate insulating film 105 by the third doping step.

Through the above steps, an impurity regions are formed in each semiconductor layer.

Next, the mask made of resist is removed, and an insulating film 108 containing hydrogen is formed as a passivation film. The insulating film 108 is formed with an insulating film containing silicon to a thickness from 100 nm to 200 nm by plasma CVD or sputtering. In this embodiment, a silicon nitride formed by sputtering is used. The insulating film has an Ar concentration of about $5 \times 10^{18}$ atoms/cm$^3$ to $5 \times 10^{20}$ atoms/cm$^3$.

Moreover, the semiconductor layers is hydrogenated by heat treatment at a temperature of 410° C. for one hour in a nitrogen atmosphere.

In order to activate the impurity element, heat-treatment, irradiation with intense light, or irradiation with a laser beam may be carried out. Simultaneously with the activation, plasma damage in the gate insulating film or plasma damage at an interface between the gate insulating film and the semiconductor layer can be repaired.

A heat-resistant planarizing film 109, which serves as an interlayer insulating film, is formed. The heat-resistant planarizing film 109 is formed of an insulating film having a skeletal structure composed of a bond of silicon (Si) and oxygen (O), which is obtained by the coating method.

Note that the formation steps of the heat-resistant planarizing film 109 are omitted since the steps are described in Embodiment Mode.

Thus, the heat-resistant planarizing film 109 is formed (FIG. 1A)

Next, a pixel electrode 110 is formed on the heat-resistant planarizing film 109. In this embodiment, a transparent conductive film is formed and etched to the desired shape, thereby forming the pixel electrode 110 (FIG. 1B). In this embodiment, ITSO is used for the pixel electrode 110. The pixel electrode 110 is cleaned with porous body of polyvinyl alcohols and polished by CMP so that the surface thereof is made flat. Further, the surface of the pixel electrode 110 may be processed with oxygen plasma or exposed to ultraviolet irradiation after the polishing by CMP.

Subsequently, with the use of a mask made of resist, the heat-resistant planarizing film 109 at an end portion is removed concurrently with the formation of a contact hole 111(opening portion) which is formed in the heat-resistant planarizing film 109. In this embodiment, Etching (wet etching or dry etching) is performed under the condition in which a desirable selectivity can be obtained with respect to the gate insulating film 105. In this embodiment, $CF_4$, $O_2$, He, and Ar are used. Dry etching is performed under the conditions of the $CF_4$ flow rate of 380 sccm; the $O_2$ flow rate of 290 sccm; the He flow rate of 500 sccm; the Ar flow rate of 500 sccm; the RF power of 3,000W; and a pressure of 25 Pa.

In order to etch without leaving residue on the gate insulating film 105, it is preferable that etching time be increased by 10% to 20%. The tapered shape is obtained by performing the second dry etching with the use of $CF_4$, $O_2$, and He by setting the flow of $CF_4$ at 550 sccm; $O_2$, 450 sccm; He, 350 sccm; RF power, 3000W; and a pressure, 25 Pa. The taper angle θ of the sides for the heat-resistant planarizing film is desirably set at not less than 30° and not more than 75°.

The gate insulating film 105 is etched to form an opening reaching the source region and the drain region. In this embodiment, the opening is formed by etching the insulating film 108 and the gate insulating film 105 by using the etched heat-resistant planarizing film 109 as a mask after etching the heat-resistant planarizing film 109. The mask used for the etching may be the etched heat-resistant planarizing film 109. The gate insulating film 105 is etched by using $CHF_3$ and Ar as an etching gas. Note that the etching time is preferably increased by 10% to 20% for etching without leaving residue over the semiconductor layer. Thus, a contact hole 111 is formed (FIG. 1C).

A metal film is formed and etched to form a wiring 112 which is electrically connected to respective impurity regions. In this embodiment, TiN/Al/TiN are each stacked to be 100 nm/350 nm/100 nm, and thereafter patterned to the desired shape to form the wiring. TiN is one of the materials which have good adhesion with the heat-resistant planarizing film. Further, TiN has good adhesion also with ITSO. In addition, the content of N in TiN is preferably less than 44 atomic % to obtain a contact with the source region or the drain region of a TFT.

Etching is performed by ICP (inductively coupled plasma) etching using $BCl_3$ and $Cl_2$. The etching condition is as below: the power applied to a coiled electrode is 450 W and the power applied to an electrode on the substrate side is 100 W, and under the pressure of 1.9 Pa. Hereupon, the pixel electrode 110 which is formed in advance serves as an etching stopper. The difference between the selectivity of the wiring 112 to the pixel electrode 110 and the selectivity of the wiring 112 to the heat-resistant planarizing film 109 makes the heat-resistant planarizing film 109 having lower selectivity etched, so that a depression 113 is formed (FIG. 1D).

Subsequently, an insulator 114 (also referred to as a bank, a partition wall, a barrier, and the like) which covers the depression 113, an end portion of the pixel electrode 110 and the wiring 112 is formed (FIG. 1E). As the insulator 114, a SOG film (such as a SiOx film containing an alkyl group) with a film thickness of 0.8 μm to 1.0 μm is formed by a coating method. The insulator 114 may be either dry etched or wet etched. In this embodiment, the insulating film 114 is formed by dry etching using a mixed gas of $CHF_3$, $O_2$, and He. In the dry etching, the etching rate of the SiOx film containing an alkyl group is 500 to 600 nm/min, whereas the etching rate of the ITSO film is 10 nm/min or less. Accordingly, favorable etching ratio can be obtained. Since the wiring 112 is covered with the insulator 114 formed with a SiOx film having an alkyl group, the TiN film which has high adhesion is provided as the outermost layer. In the invention, the pixel electrode 110 is used as the etching stopper for forming the wiring. Therefore, the process is simplified. Further, the depression formed in the heat-resistant planarizing film 109 does not matter since the depression is filled by the insulator 114.

According to the above-described steps, an active matrix substrate comprising a TFT is completed.

Not limited to a method for manufacturing a TFT described in this embodiment, the present invention can be applied to a top gate type (planar type), a bottom gate type (inversely staggered type), or a dual gate type having two gate electrodes disposed above and below a channel region while interposing a gate insulating film therebetween.

In order to improve the reliability, a vacuum heating is carried out to perform degassing prior to forming a light emitting layer 115 including an organic compound. In order to remove gases contained in the substrate, for example, heat treatment is performed at a temperature of from 200° C. to 300° C. under a reduced pressure atmosphere or an inert atmosphere prior to carrying out vapor deposition of an organic compound material. Since the interlayer insulating film and the partition wall are formed of the heat-resistant SiOx film, a problem is not caused even if the heat treatment is performed at high temperature. Accordingly, a step for improving reliability by heat treatment can be performed.

A light emitting layer 115 is formed on the pixel electrode 110. In this embodiment, a low molecular weight organic light emitting material formed by deposition is used. Specifically, an EL layer has a laminated structure having a copper phthalocyanine (CuPc) film provided with a thickness of 20 nm as the hole injecting layer and a tris-8-quinolinolato aluminum complex ($Alq_3$) film provided thereover with a thickness of 70 nm as the light emitting layer. Colors of light emission can be controlled by adding fluorescent dye such as quinacridone, perylene, or DCM 1 to $Alq_3$.

Next, an electrode 116 formed with a conductive film is provided on the light emitting layer 115. In this embodiment, the electrode 116 serves as a cathode, and light is released from the side of the pixel electrode 110 which serves as an anode. Therefore, it is preferable to use a metal film(with a thickness from 50 nm to 200 nm) formed of Al, Ag, Li, and Ca, or alloy of those elements such as MgAg, MgIn, or AlLi, for the electrode 116.

It is effective to provide a passivation film 117 so as to completely cover the electrode 116. In this embodiment, a diamond like carbon (DLC) is used for the passivation film. The DLC film has a high blocking effect to oxygen and can suppress oxidization of the light emitting layer 115. Consequently, a problem of oxidation of the light emitting layer 115 during the following sealing step can be avoided.

Next, a sealing substrate 119 is attached to encapsulate the light emitting element. The encapsulation is performed as an end portion of the heat-resistant planarizing film is covered with a sealant. The deterioration of the light emitting element can be prevented since the penetration of moisture through the cross section can be prevented with the use of the sealant; thus, the reliability of the light emitting display device can improved. The area surrounded by the sealant is filled with a filler 118. In this embodiment, the filler is not required to transmit light since the light is released through the pixel electrode 110; meanwhile, in the case where the light is released through the filler 118, it is required to transmit light. In this embodiment, a high heat-resistant UV ray curable epoxy resin (#2500 Clear, manufactured by Electro-Lite Corporation) having the refractive index of 1.50; the viscosity of 500 cps; a Shore D hardness of 90; tensile strength of 3,000 psi; the Tg point of 150° C.; the volumetric resistivity of $1\times10^{15}$ Ω·cm; and a withstand voltage of 450 V/mil is used. The total light transmittance can be improved by filling the filler 118 between the pair of substrates.

Figure 8:
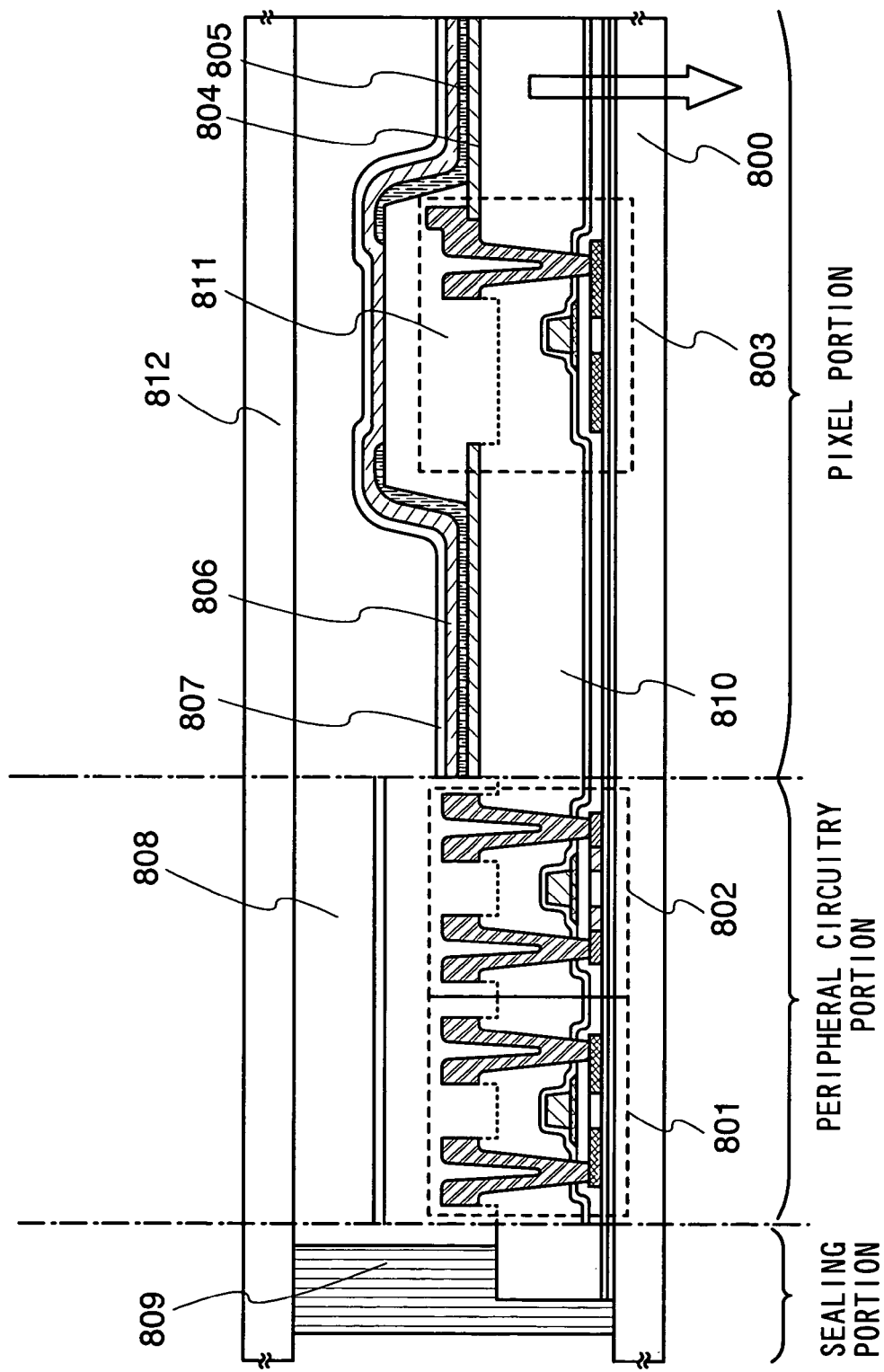
FIG. 8 is a cross-sectional view of a light emitting display device of the invention.
Figure 14:
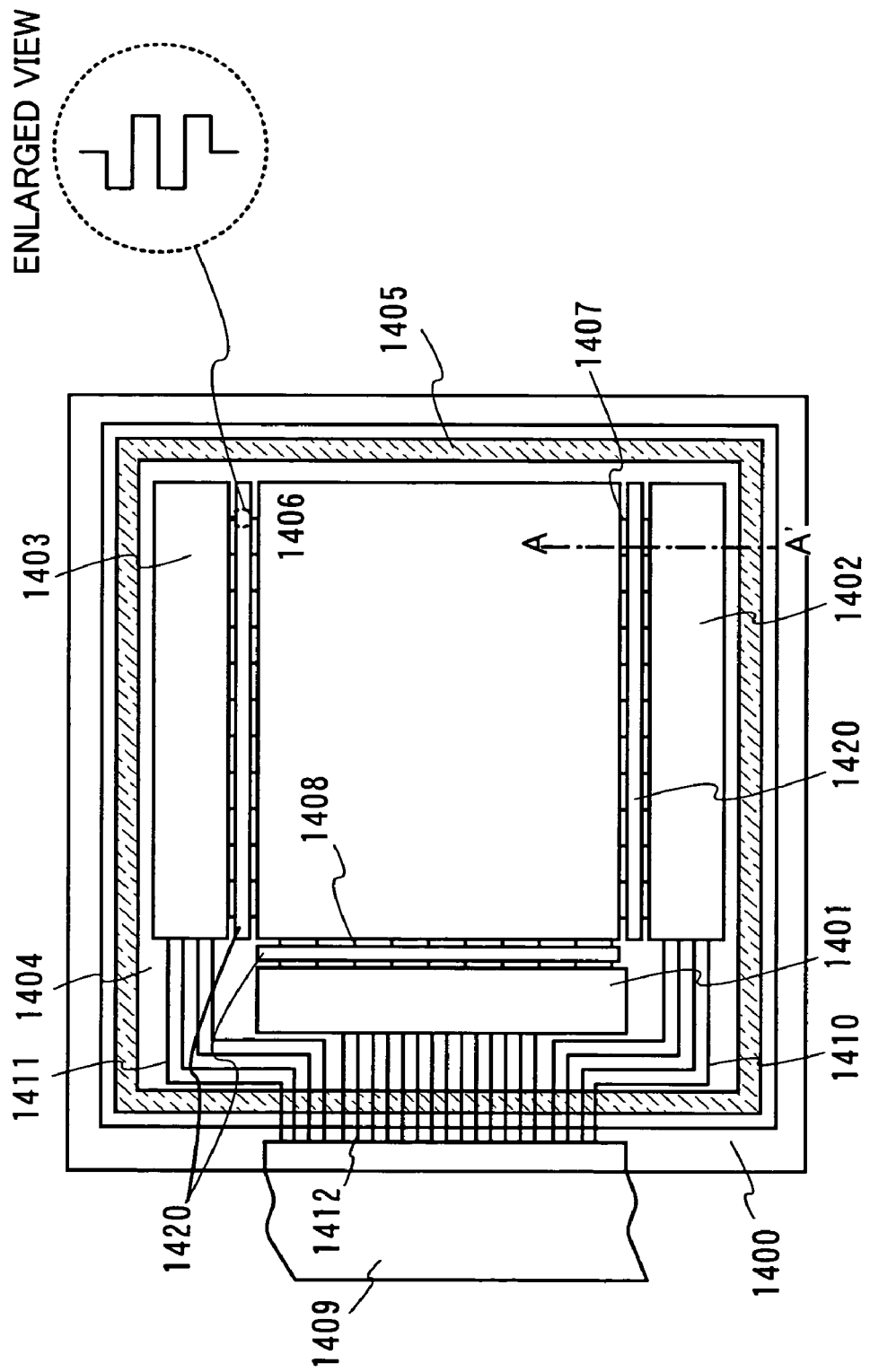
FIG. 14 is a top view of a display device according to the invention.

A schematic top view of the light emitting display device of the invention is shown in FIG. 14. Reference numeral 1400 denotes a substrate, 1401 denotes a source line driver circuit, 1402 and 1403 denote gate line driver circuits, 1404 denotes a sealing substrate, 1405 denotes a sealant, 1406 denotes a pixel area, 1407 denotes a scan line, 1408 denotes a signal line, 1409 denotes an FPC, 1410, 1411, and 1412 denote wirings, and 1420 denotes a protective circuit. A cross-sectional view along line A-A' in FIG. 14 is shown in FIG. 8. Reference numeral 800 denotes a substrate, 801, 802, and 803 denote TFTs, 804 denotes a pixel electrode, 805 denotes a light emitting layer, 806 denotes an electrode, 807 denotes a passivation film, 808 denotes a filler, 809 denotes sealant, 810 denotes a heat-resistant planarizing film, 811 denotes a partition wall, and 812 denotes a sealing substrate. In this embodiment, the light emitting display device includes the circuits as above; however, the invention is not limited thereto. A passive matrix circuit or an active matrix circuit may be used, and an IC chip may be mounted by COG or TAB, or may be integrally formed as a peripheral driver circuit. Further, the gate line driver circuit and the source line driver circuit may be provided plurally or singularly.

An enlarged view of the protective circuit 1420 is shown in FIG. 14. The protective circuit of this embodiment has wirings made to be bended as in the enlarged view to form a capacitor; thus, static can be controlled, and defects of the display device such as electrostatic discharge damage can be prevented. The protective circuit is not limited to this embodiment, and it can be used in combination with a TFT, a capacitor, a diode, or the like. The protective circuit further improves the reliability of the display device.

Thus manufactured active matrix light emitting display device includes the heat-resistant planarizing film as interlayer insulating film of a TFT. The heat-resistant planarizing film is formed of a material typically having a skeletal structure composed of a bond of silicon (Si) and oxygen (O). The partition wall also uses the same material. Relatively stable materials containing silicon oxide are employed for the constituent materials of the active matrix light emitting device, thereby improving the reliability of the light emitting device.

Further, the pixel electrode 110 is used as an etching stopper; accordingly, the process can be simplified, and a display device can be manufactured with higher yield and at lower cost.

Embodiment 2

In this embodiment, examples of top emission type and dual emission type light emitting display devices manufactured according to Embodiment 1 will be described with reference to FIG. 5 and FIG. 9.

Figure 5:
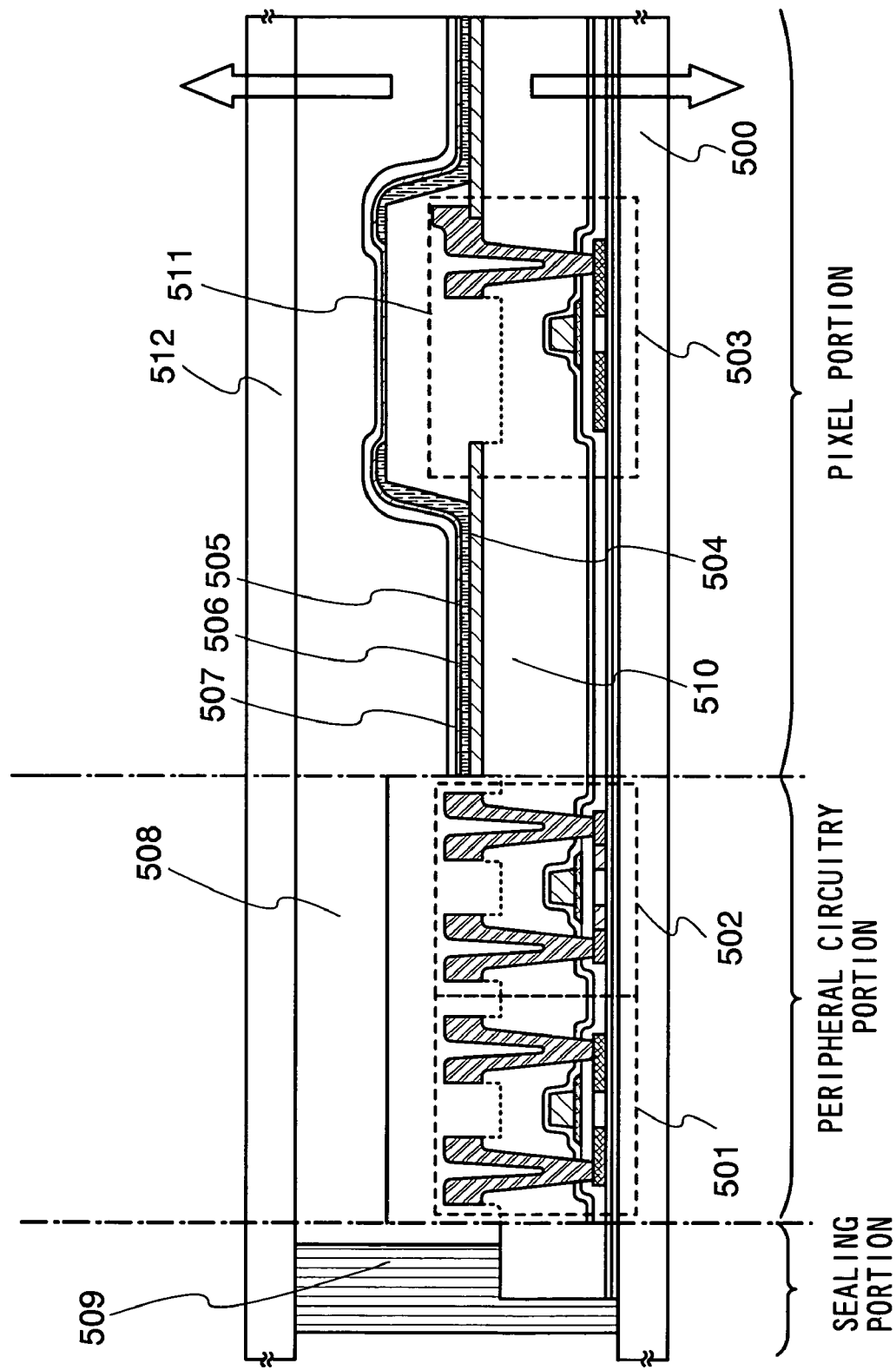
FIG. 5 is a cross-sectional view of a light emitting display device of the invention.

In FIG. 5, reference numeral 500 denotes a substrate, 501, 502, and 503 denote TFTs, 504 denotes a pixel electrode, 505 denotes a light emitting layer, 506 denotes an electrode, 507 denotes a transparent conductive film, 508 denotes a filler, 509 denotes a sealant, 510 denotes a heat-resistant planarizing film, 511 denotes a partition wall, and 512 denotes a sealing substrate.

A light emitting display device in FIG. 5 is a dual emission type, which has a structure in which light is emitted from both top and bottom surfaces in the directions of arrows. In this embodiment, a transparent conducive film is formed and etched to the desired shape to form the pixel electrode 504. A conductive film formed by mixing 2% to 20% of zinc oxide (ZnO) into indium oxide besides ITO, IZO, or ITSO can be used for the pixel electrode 504. A titanium nitride film or a titanium film other than the above-mentioned transparent conductive film may be used for the pixel electrode 504. In this case, after the transparent conductive film is formed, a titanium nitride film or a titanium film is formed to the thickness (preferably about 5 nm to 30 nm) which can transmit light. In this embodiment, ITSO is used for the pixel electrode 504.

Next, an electrode 506 formed with a conductive film is provided on the light emitting layer 505. The electrode 506 may be made of a material having lower work function (for example, Al, Ag, Li, or Ca, or alloy of these elements such as MgAg, MgIn, AlLi, CaF2, or CaN). In this embodiment, a stack of a thin metal film (MgAg: 10 nm in thickness) as the electrode 506 and a 100-nm-thick ITSO film as a transparent conductive film 507 is used so that the light can transmit. The ITSO film is formed by sputtering using a target in which silicon oxide (SiO$_2$) of 1% to 10% is mixed into indium tin oxide under the conditions of an Ar gas flow rate of 120 sccm; an O$_2$ gas flow rate of 5 sccm; a pressure of 0.25 Pa; and an electric power of 3.2 kW. After forming the ITSO film, heat treatment is carried out at 200° C. for one hour. The transparent conductive film 507 can use ITO (indium oxide tin oxide alloy), indium oxide zinc oxide alloy, zinc oxide, tin oxide, or indium oxide.

In the case of a structure shown in FIG. 5, the light emitted from the light emitting element is released through the pixel electrode 504, and both of the electrodes 506 and 507.

Figure 9:
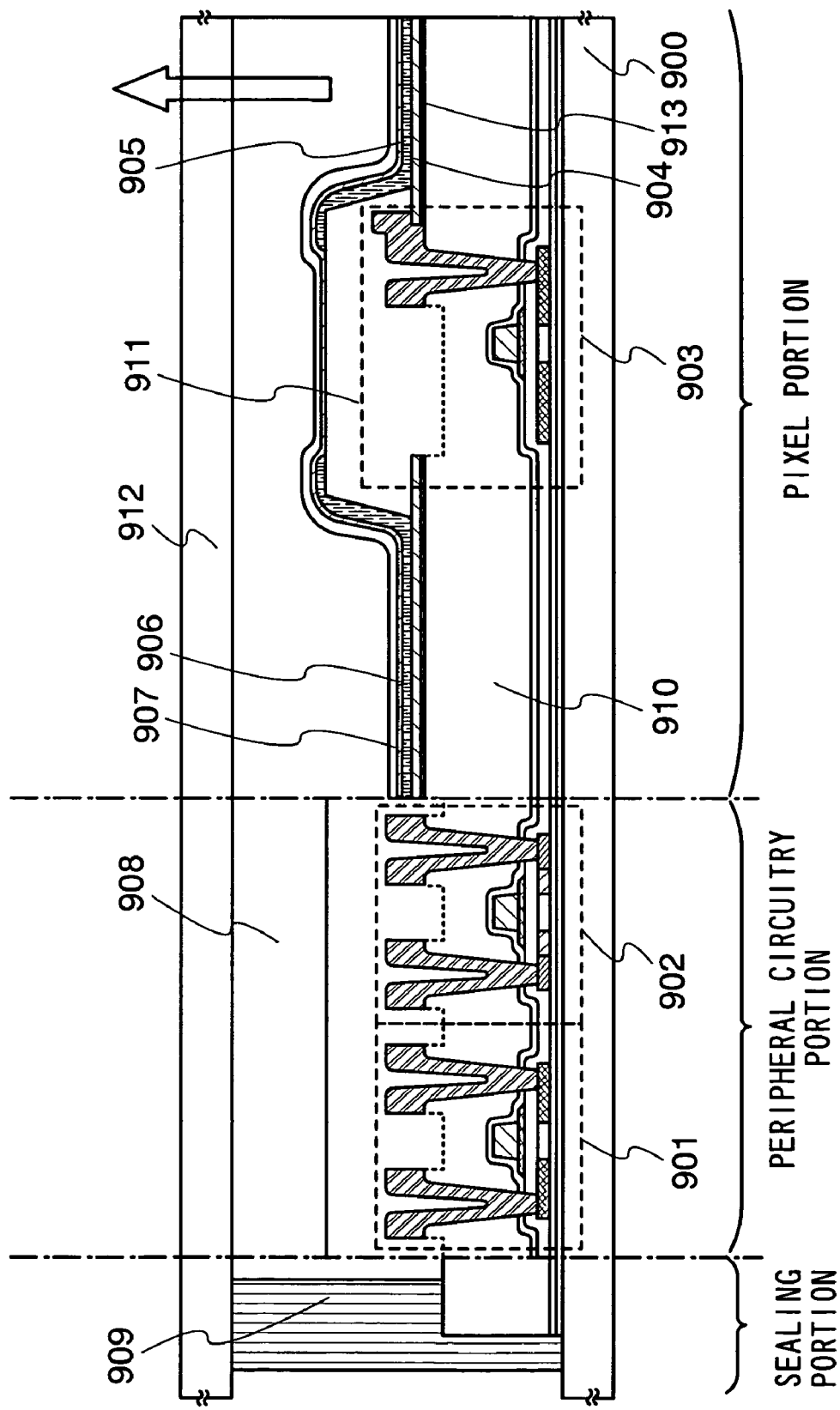
FIG. 9 is a cross-sectional view of a light emitting display device of the invention.

A light emitting display device as illustrated in FIG. 9 is a one-sided emission type and has a structure in which light is emitted upward in the direction shown by the arrow. In FIG. 9, reference numeral 900 denotes a substrate, 901, 902, and 903 denote TFTs, 913 denotes a reflective metal film, 904 denotes a pixel electrode, 905 denotes a light emitting layer, 906 denotes an electrode, 907 denotes a transparent conductive film, 908 denotes a filler, 909 denotes a sealant, 910 denotes a heat-resistant planarizing film, 911 denotes a partition wall, and 912 denotes a sealing substrate. In this case, the reflective metal film 913 is formed under the pixel electrode 904 in the dual emission light emitting display device shown in FIG. 5. A transparent conductive film is formed on the reflective metal film 913 as the pixel electrode 904 which serves as an anode. Since the metal film 913 only requires reflectivity, Ta, W, Ti, Mo, Al, Cu, or the like can be used. In this embodiment, TiN film is used.

An electrode 906 formed with a conductive film is provided on the light emitting layer 905. The electrode 906 may be made of a material having lower work function (for example, Al, Ag, Li, or Ca, or alloy of these elements such as MgAg, MgIn, AlLi, CaF2, or CaN) since the electrode is made to serve as a cathode. In this embodiment, a stack of a thin metal film (MgAg: 10 nm in thickness) as the electrode 906 and a 110-nm-thick ITSO film as the transparent conductive film 907 is used so that the light can be released out. The transparent conductive film 907 may use ITO (indium oxide tin oxide alloy), indium oxide zinc oxide alloy, zinc oxide, tin oxide, or indium oxide.

In the case of a structure shown in FIG. 9, the light emitted from the light emitting element is reflected at the reflective metal film 913 and released upward through the electrode 906, the transparent electrode 907, and the like.

The display device of this invention includes the heat-resistant planarizing film as interlayer insulating film of a TFT. The heat-resistant planarizing film is typically formed of a material having a skeletal structure composed of a bond of silicon (Si) and oxygen (O). The partition wall also uses the same material. Relatively stable materials containing silicon oxide are employed for the constituent materials of the active matrix light emitting device, thereby improving the reliability of the light emitting device. Further, the pixel electrode 110 is used as an etching stopper; accordingly, the process can be simplified, and a display device can be manufactured with higher yield and at lower cost.

Embodiment 3

In this embodiment, an example of an inverted staggered TFT will be described with reference to FIG. 6 and FIG. 7. Parts aside from the TFT is similar to FIG. 5 described in Embodiment Mode; the detailed description thereof is omitted here.

Figure 6:
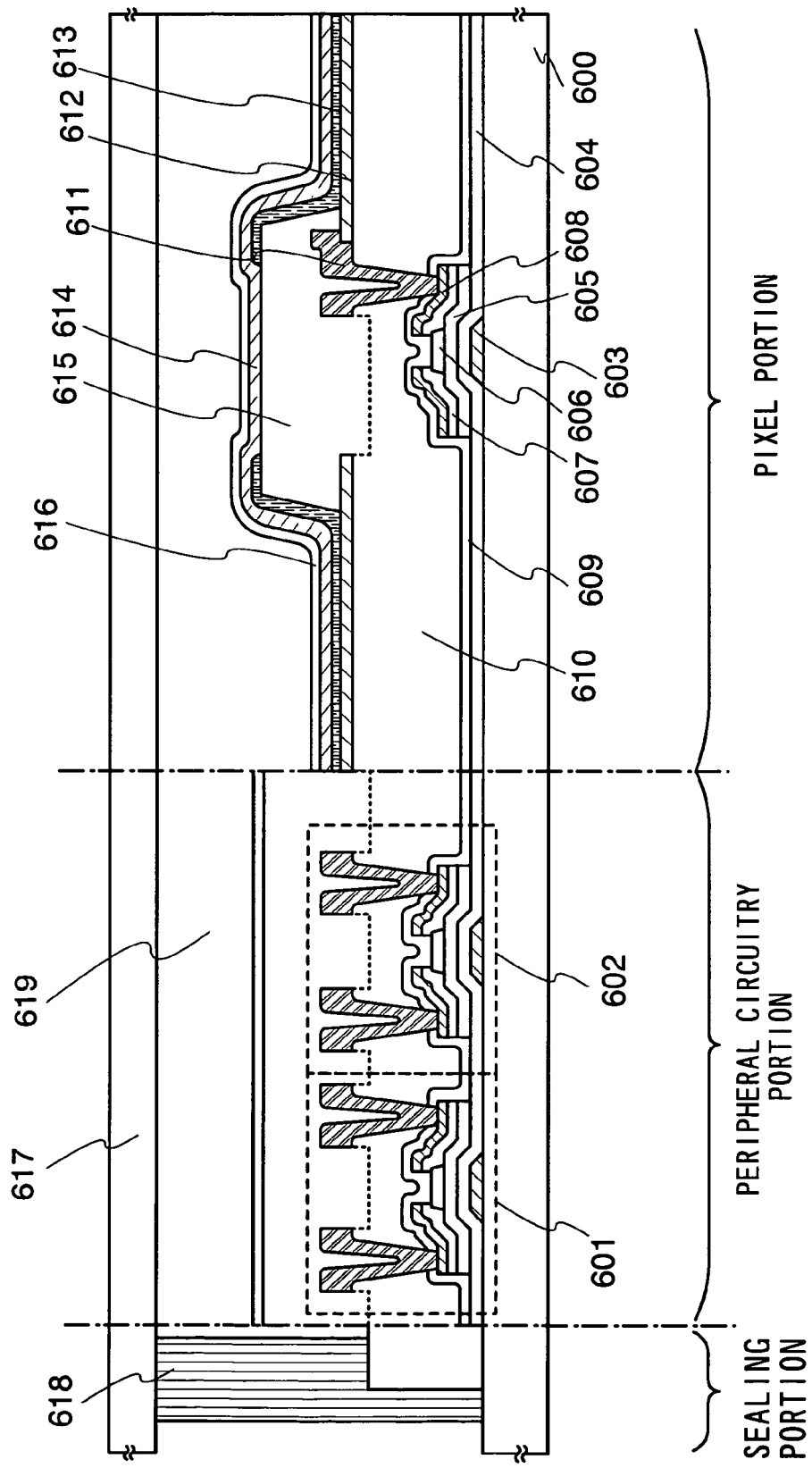
FIG. 6 is a cross-sectional view of a light emitting display device of the invention.

FIG. 6 shows a channel stop type TFT. Reference numeral 600 denotes a substrate, 601 and 602 denote TFTs of a driver circuit area. A gate insulating film 604, a semiconductor layer 605 formed with an amorphous semiconductor film, an n+ layer 607, and a metal layer 608 are formed over a gate electrode 603. A channel stopper 606 is formed above an area which will become a channel region of the semiconductor layer 605. A source or drain electrode 611 is formed. Reference numeral 609 denotes an insulating film, 612 denotes a first electrode, 613 denotes a light emitting layer, 614 denotes a second electrode, 616 denotes a passivation film, 619 denotes a filler, 618 denotes a sealant, 610 denotes a heat-resistant planarizing film, 615 denotes a partition wall, and 617 denotes a sealing substrate.

Figure 7:
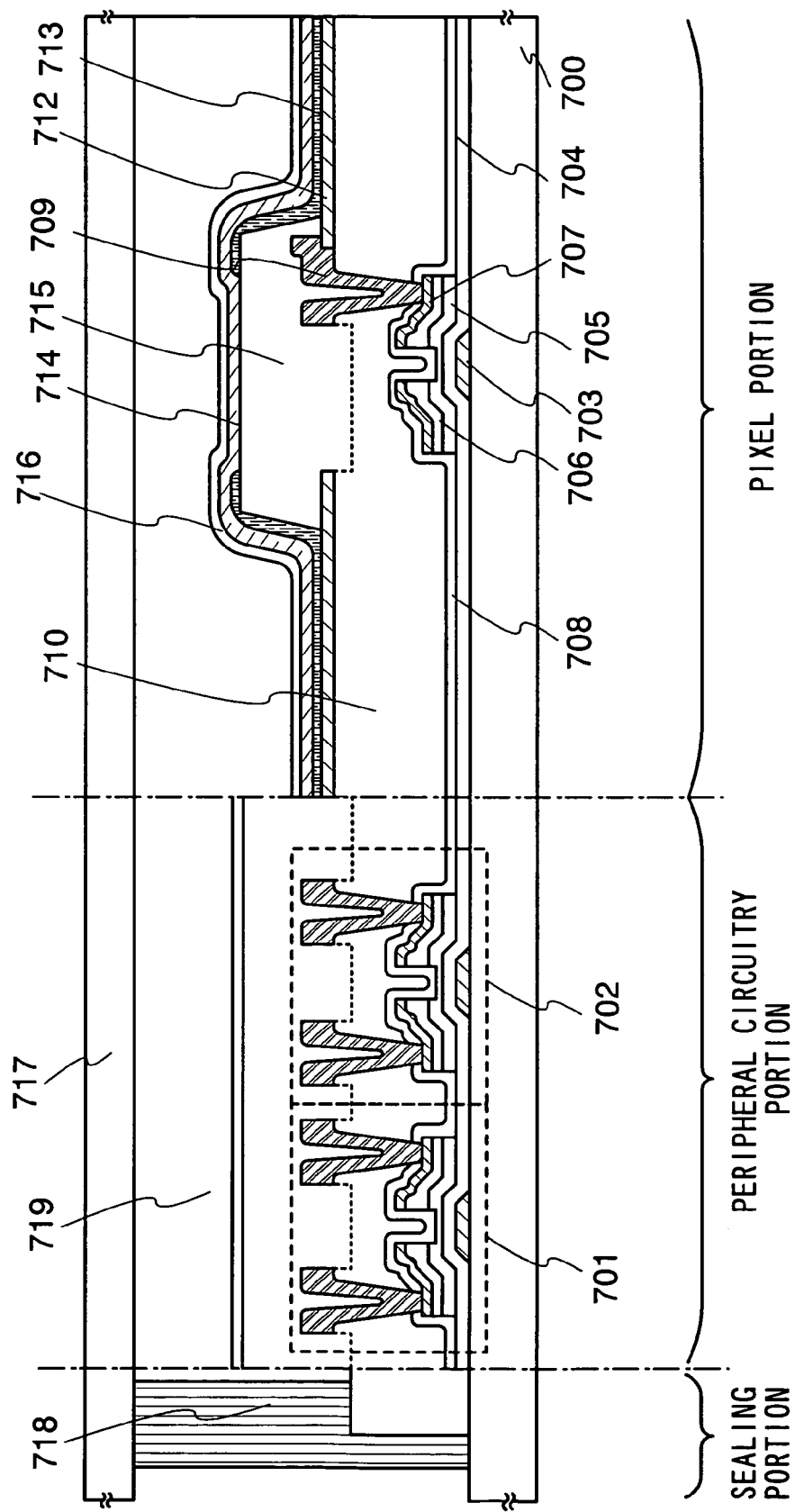
FIG. 7 is a cross-sectional view of a light emitting display device of the invention.

FIG. 7 shows a channel etch type TFT. Reference numeral 700 denotes a substrate, 701 and 702 denote TFTs of a driver circuit area. A gate insulating film 704, a semiconductor layer 705 formed with an amorphous semiconductor film, an n+ layer 706, and a metal layer 707 are formed and stacked over a gate electrode 703. An area to be a channel region of the semiconductor layer 705 is thinly etched. Further, a source or drain electrode 709 is formed. Reference numeral 708 denotes an insulating film, 712 denotes a first electrode, 713 denotes a light emitting layer, 714 denotes a second electrode, 716 denotes a passivation film, 719 denotes a filler, 718 denotes a sealant, 710 denotes a heat-resistant planarizing film, 715 denotes a partition wall, and 717 denotes a sealing substrate.

Instead of an amorphous semiconductor film, a semiamorphous semiconductor film (also referred to as a microcrystalline semiconductor film) having an intermediate structure between an amorphous structure and a crystalline structure (including a single crystalline structure, and a polycrystalline structure) can also be used. The semiamorphous semiconductor film has a third condition that is stable with respect to free energy, and includes a crystalline region having short-distance order and lattice distortion. The semiamorphous semiconductor film is formed by glow discharge decomposition with silicide gas (by plasma CVD). As for the silicide gas, $Si_2H_6$, $SiH_2Cl_2$, $SiHCl_3$, $SiCl_4$, $SiF_4$, and the like can be used, besides $SiH_4$. The silicide gas may also be diluted with $H_2$ or a mixture of $H_2$ and at least one rare gas selected from the group consisting of He, Ar, Kr, and Ne. The dilution ratio may be in the range of from 1:2 to 1:1,000. The pressure may be approximately in the range of from 0.1 Pa to 133 Pa. The power frequency is in the range of from 1 MHz to 120 MHz, preferably 13 MHz to 60 MHz. The substrate heating temperature may be set to 300° C. or less, preferably from 100° C. to 250° C. As for impurity elements contained in the film, each concentration of impurities of atmospheric constituents such as oxygen, nitrogen, and carbon is preferably set to $1\times10^{20}$ $cm^{-1}$ or less. In particular, the oxygen concentration is set to $5\times10^{19}$ atoms/$cm^3$ or less; more preferably, $1\times10^{19}$ atoms/$cm^3$ or less. The electric field effect mobility μ of the TFT using the semiamorphous semiconductor film as the active layer is in the range of form 1 $cm^2$/Vsec to 10 $cm^2$/Vsec.

The inverted staggered TFTs in FIG. 6 and FIG. 7 according to this embodiment use amorphous semiconductor films for the semiconductor films. Accordingly, a TFT of a pixel area in this embodiment is an n-channel TFT. First electrodes (pixel electrodes) 612 and 712 are made to serve as cathodes, and second electrodes 614 and 714 are made to serve as anodes. In this embodiment, ITSO which is a transparent conductive layer is used for the first and the second electrodes. The following structure is: the first electrode (ITSO)/an electron injection layer (BzOS—Li in which benzoxazoles (BzOs) is doped with Li)/an electron transport layer (Alq)/a light emitting layer (Alq doped with quinacridone derivatives (DMQd))/a hole transport layer (4,4'-bis [N-(1-naphthyl)-N-phenyl-amino]-biphenyl (α-NPD))/a hole injection layer (molybdenum oxide (MoOx))/the second electrode (ITSO). Materials for the anode; the cathode; and the electron injection layer, the electron transport layer, the light emitting layer, the hole transport layer, and the hole injection layer each of which forms an EL layer are not limited to this embodiment. The materials may be appropriately selected and combined.

Figure 16A:
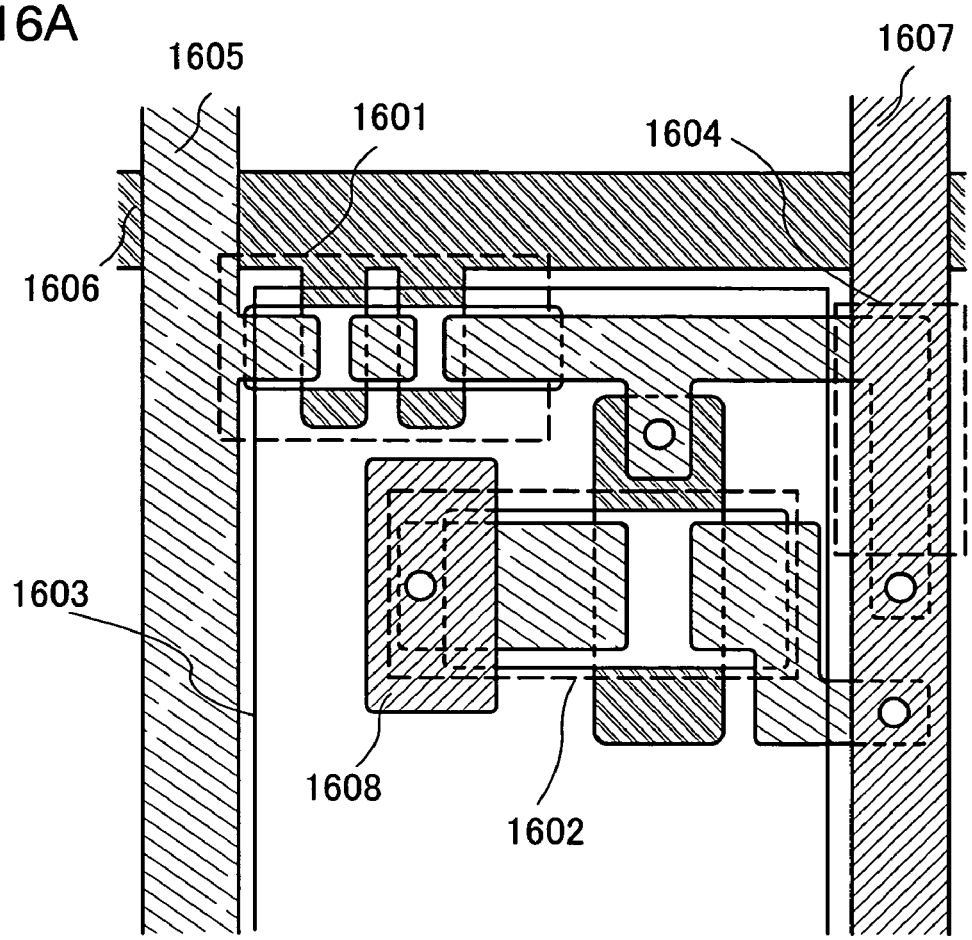
FIGS. 16A and 16B is a top view and cross-sectional view of the invention.
Figure 16B:
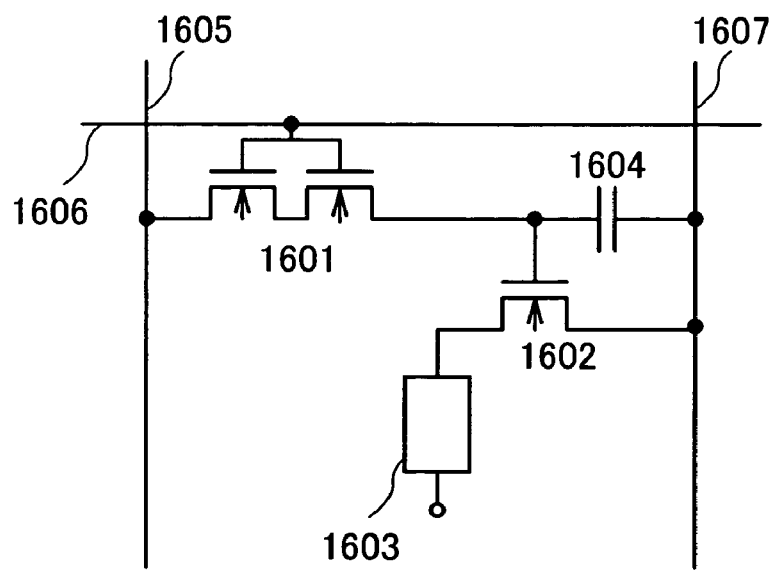

A top view of the pixel area of the display device according to the embodiment is shown in FIG. 16A, and a circuit diagram thereof is shown in FIG. 16B. Reference numerals 1601 and 1602 denote TFTs, 1603 denotes a light emitting element, 1604 denotes a capacitor, 1605 denotes a source line, 1606 denotes a gate line, 1607 denotes a power line, 1608 denotes connection electrode connecting to a pixel electrode forming the light emitting element 1603.

A display device according to the invention includes the heat-resistant planarizing film as interlayer insulating film of a TFT. The heat-resistant planarizing film is typically formed of a material having a skeletal structure composed of a bond of silicon (Si) and oxygen (O). The partition wall also uses the same material. Relatively stable materials containing silicon oxide are employed for the constituent materials of the active matrix light emitting device, thereby improving the reliability of the light emitting device. Further, the pixel electrode 110 is used as an etching stopper; accordingly, the process can be simplified, and a display device can be manufactured with higher yield and at lower cost.

Embodiment 4

Various display devices can be manufactured by applying the present invention. In other words, this invention can be applied to the various electronic devices including the display devices in the display areas.

Such electronic devices typically include a video camera; a digital camera; a projector, a head mounted display (a goggle type display); a car navigation system; a car stereo, a personal computer, a game machine, a portable information terminal (such as a mobile computer, a cellular phone, or an electronic book), an image reproduction device having a recording medium (specifically, a device having a display that can reproduce a recording medium such as a digital versatile disc (DVD) and can display the image), and the like. Examples thereof are shown in FIG. 10A to 10E FIG. 10A, shows an example of a display device including a large display area of 20 to 80 inches. The display device further includes a housing 2001, a support 2002, a display area 2003, a speaker portion 2004, a video input terminal 2005 and the like. The invention is applied to the formation of the display area 2003. It is preferable to manufacture this kind of large-sized display device by using a large substrate as the so-called fifth generation (1000×1200 mm), the sixth generation (1400×1600 mm), or the seventh generation (1500×1800 mm) in view of productivity and cost.

Figure 10A:
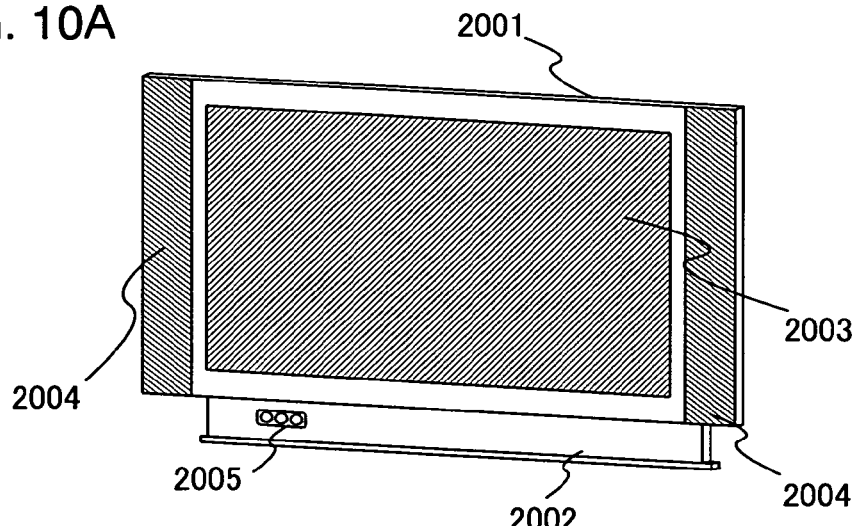
FIGS. 10A to 10E are figures which show display devices according to the invention.
Figure 10B:
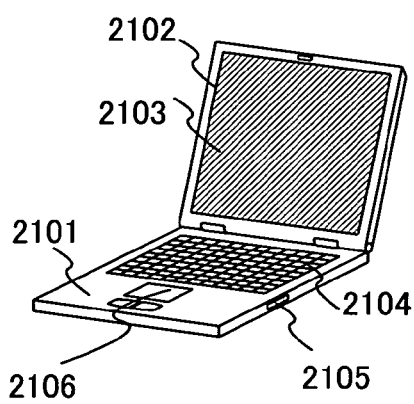

FIG. 10B shows a notebook personal computer including a main body 2101, a housing 2102, a display area 2103, a keyboard 2104, an external connection port 2105, and a pointing mouse 2106. The invention is applied to the formation of the display area 2103. Thus, reliable high-resolution images can be displayed at low cost.

Figure 10C:
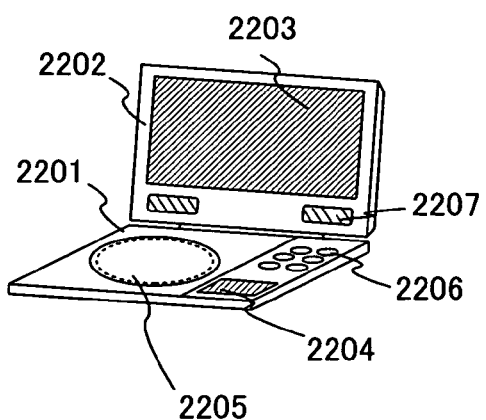

FIG. 10C shows an image reproduction device having a recording medium (specifically, a DVD playback system) including a main body 2201, a housing 2202, a display area A 2203, a display area B 2204, a reading section 2205 which reads a recording medium (DVD or the like), an operation key 2206, a speaker portion 2207. The display area A 2203 mainly displays image information, and the display area B 2204 mainly displays text information. The invention is applied to the formation of the display area A 2203 and the display area B 2204. Thus, reliable high-resolution images can be displayed at low cost.

Figure 10D:
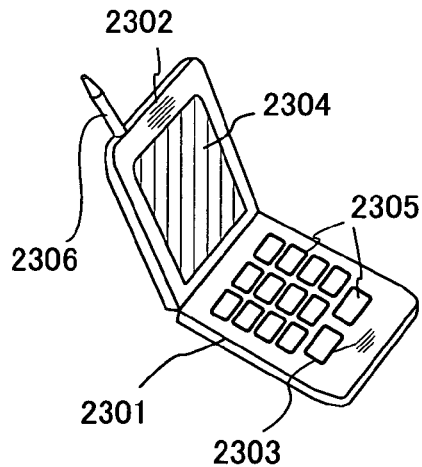

FIG. 10D shows a cellular phone including a main body 2301, an audio output section 2302, an audio input section 2303, a display area 2304, an operation switch 2305, and an antenna 2306. The invention is applied to the formation of the display area 2304. Thus, even a cellular phone, which is often used in hot and humid environment, such as outside, can display reliable high-resolution images.

Figure 10E:
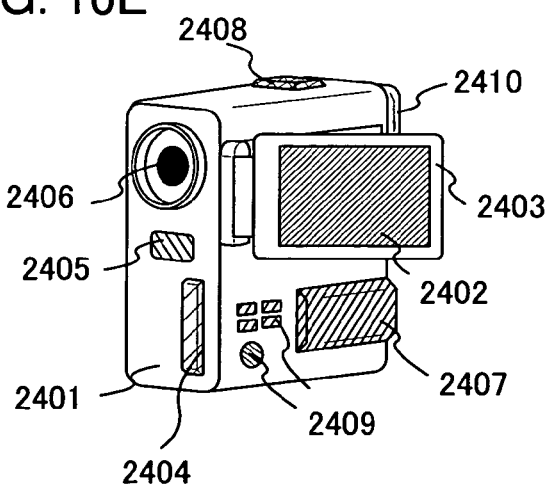

FIG. 10E shows a video camera including a main body 2401, a display area 2402, a housing 2403, an external connection terminal 2404, a wireless remote controller receiver 2405, an image receiving section 2406, a battery 2407, an audio input section 2408, an operation key 2409 and an eye piece 2410. The invention is applied to the display area 2402. Thus, even though the video camera is used in hot and humid environment, such as outside, reliable high-resolution images can be displayed.

Figure 11:
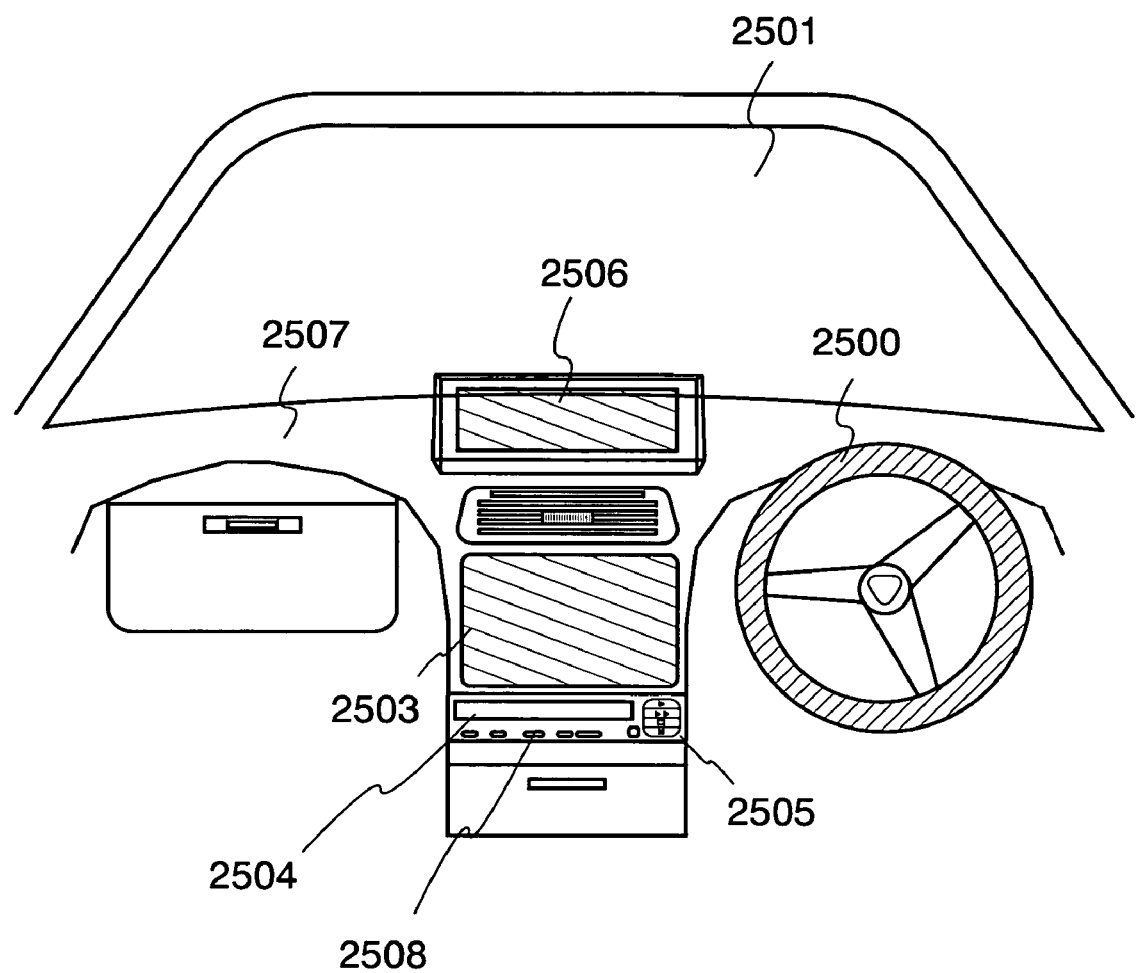
FIG. 11 is a figure which shows a display device according to the invention.

FIG. 11 shows an example of mounting a display area on an automobile. Here, an automobile is used as a typical example of a vehicle; however, the invention is not particularly limited thereto. The invention can be applied to an aircraft, a train, an electric train, or the like. Particularly, as for a display device mounted on an automobile, high reliability is required even in a severe environment (inside of an automobile which is subject to high temperatures and high humidity).

FIG. 11 shows the vicinity of a driver's seat in an automobile. Reference numeral 2500 denotes steering wheel, and 2501 denotes car windshield. A dashboard 2507 is provided with audio reproducing devices, specifically a car audio system and a car navigating system. A main body 2505 of the car audio system includes display areas 2503 and 2504, operation button 2508. By applying the invention to the display areas 2503 and 2504, a car audio system with high reliability can be completed.

By applying the invention to the display area 2503 of the car navigation system and to a display area 2506 which displays air conditions inside a car, a car navigation system with high reliability can be completed.

Further, an on-board car audio system and a car navigation system are described in this embodiment; however, the invention may be applied to indicators of other vehicles and to stationary audios, and navigating systems.

As described above, the application range of the invention is extremely wide, and the invention can be applied to electronic devices of various fields. Note that, these embodiments show the case of using a light emitting device, however, this invention may be applied to other display device such as a liquid crystal display device.

What is claimed is:

1. A manufacturing method of a display device comprising the steps of:
    forming a thin film transistor having a gate insulating film, a gate electrode and a semiconductor layer having a source region, a drain region and a channel forming region between the source and drain regions over a first substrate with an insulating surface;
    forming an insulating film over the thin film transistor;
    selectively forming a first electrode over the insulating film;
    forming an opening disposed above the source region or the drain region by selectively removing the insulating film;
    forming a contact hole reaching the source region or the drain region by selectively removing the gate insulating film;
    forming a conductive film on the first electrode and the insulating film;
    forming a source electrode or a drain electrode reaching the source region or the drain region, and a depression in the insulating film by selectively removing the conductive film and the insulating film;
    forming a partition wall covering the source electrode or the drain electrode, an end portion of the first electrode, and the depression in the insulating film;
    forming a layer containing an organic compound on the first electrode;
    forming a second electrode on the layer containing an organic compound; and
    encapsulating a display element including the first electrode, the layer containing an organic compound and the second electrode over the first substrate by pasting a second substrate to the first substrate with a sealant surrounding a peripheral portion of the display element.

2. A manufacturing method of a display device according to claim 1,
    wherein the insulating film is a silicon oxide film containing an alkyl group which is formed by a coating method.

3. A manufacturing method of a display device according to claim 1, wherein the partition wall is a silicon oxide film containing an alkyl group formed by a coating method.

4. A manufacturing method of a display device according to claim 1,
wherein the first electrode is formed by sputtering using a target of indium tin oxide containing silicon oxide.

5. A manufacturing method of a display device comprising the steps of:
forming a thin film transistor having a gate insulating film, a gate electrode and a semiconductor layer having a source region, a drain region and a channel forming region between the source and drain regions over a first substrate with an insulating surface;
forming a heat-resistant planarizing film over the thin transistor;
selectively forming a first electrode over the heat-resistant planarizing film;
forming an opening disposed above the source region or the drain region by selectively removing the heat-resistant planarizing film;
forming a contact hole reaching the source region or the drain region by selectively removing the gate insulating film;
forming a conductive film on the first electrode and the heat-resistant planarizing film;
forming a source electrode or a drain electrode reaching the source region or the drain region, and a depression in the heat-resistant planarizing film by selectively removing the conductive film and the heat-resistant planarizing film;
forming a partition wall covering the source electrode or the drain electrode, an end portion of the first electrode, and the depression in the heat-resistant planarizing film;
forming a layer containing an organic compound on the first electrode;
forming a second electrode on the layer containing an organic compound; and
encapsulating a display element including the first electrode, the layer containing an organic compound and the second electrode over the first substrate by pasting a second substrate to the first substrate with a sealant surrounding a peripheral portion of the display element.

6. A manufacturing method of a display device according to claim 5,
wherein the heat-resistant planarizing film is a silicon oxide film containing an alkyl group which is formed by a coating method.

7. A manufacturing method of a display device according to claim 5,
wherein the partition wall is a silicon oxide film containing an alkyl group formed by a coating method.

8. A manufacturing method of a display device according to claim 5,
wherein the first electrode is formed by sputtering using a target of indium tin oxide containing silicon oxide.

9. A manufacturing method of a display device comprising the steps of:
forming a thin film transistor having a gate insulating film, a gate electrode and a semiconductor layer having a source region, a drain region and a channel forming region between the source and drain regions over a substrate with an insulating surface;
forming an insulating film over the thin film transistor;
selectively forming a first electrode over the insulating film;
forming an opening disposed above the source region or the drain region by selectively removing the insulating film;
forming a contact hole reaching the source region or the drain region by selectively removing the gate insulating film;
forming a conductive film on the first electrode and the insulating film; and
forming a source electrode or a drain electrode reaching the source region or the drain region, and a depression in the insulating film by selectively removing the conductive film and the insulating film.

10. A manufacturing method of a display device according to claim 9,
wherein the insulating film is a silicon oxide film containing an alkyl group which is formed by a coating method.

11. A manufacturing method of a display device according to claim 9,
wherein the first electrode is formed by sputtering using a target of indium tin oxide containing silicon oxide.

12. A manufacturing method of a display device comprising the steps of:
forming a thin film transistor having a gate insulating film, a gate electrode and a semiconductor layer having a source region, a drain region and a channel forming region between the source and drain regions over a substrate with an insulating surface;
forming a heat-resistant planarizing film over the thin film transistor;
selectively forming a first electrode over the heat-resistant planarizing film;
forming an opening disposed above the source region or the drain region by selectively removing the heat-resistant planarizing film;
forming a contact hole reaching the source region or the drain region by selectively removing the gate insulating film;
forming a conductive film on the first electrode and the heat-resistant planarizing film; and
forming a source electrode or a drain electrode reaching the source region or the drain region, and a depression in the heat-resistant planarizing film by selectively removing the conductive film and the heat-resistant planarizing film.

13. A manufacturing method of a display device according to claim 12,
wherein the heat-resistant planarizing film is a silicon oxide film containing an alkyl group which is formed by a coating method.

14. A manufacturing method of a display device according to claim 12,
wherein the first electrode is formed by sputtering using a target of indium tin oxide containing silicon oxide.

15. A manufacturing method of a display device comprising the steps of:
forming a thin film transistor having a gate insulating film, a gate electrode and a semiconductor layer having a source region, a drain region and a channel forming region between the source and drain regions over a first substrate with an insulating surface;
forming an insulating film over the thin film transistor;
selectively forming a first electrode over the insulating film;
forming an opening disposed above the source region or the drain region by selectively removing the insulating film;

forming a contact hole reaching the source region or the drain region by selectively removing the gate insulating film;

forming a conductive film on the first electrode and the insulating film;

forming a source electrode or a drain electrode reaching the source region or the drain region, and a depression in the insulating film by selectively removing the conductive film and the insulating film;

forming a partition wall covering the source electrode or the drain electrode, an end portion of the first electrode, and the depression in the insulating film;

forming a layer containing an organic compound on the first electrode;

forming a second electrode on the layer containing an organic compound; and encapsulating a display element including the first electrode, the layer containing an organic compound and the second electrode over the first substrate by pasting a second substrate to the first substrate with a sealant surrounding a peripheral portion of the display element, wherein a material of the partition wall is the same as a material of the insulating film, and wherein the material of the insulating film is a silicon oxide film containing an alkyl group.

16. A manufacturing method of a display device according to claim 15, wherein the insulating is formed by a coating method.

17. A manufacturing method of a display device according to claim 15, wherein the partition wall is a silicon oxide film containing an alkyl group formed by a coating method.

18. A manufacturing method of a display device according to claim 15, wherein the first electrode is formed by sputtering using a target of indium tin oxide containing silicon oxide.

19. A manufacturing method of a display device comprising the steps of:

forming a thin film transistor having a gate insulating film, a gate electrode and a semiconductor layer having a source region, a drain region and a channel forming region between the source and drain regions over a first substrate with an insulating surface;

forming a heat-resistant planarizing film over the thin film transistor;

selectively forming a first electrode over the heat-resistant planarizing film;

forming an opening disposed above the source region or the drain region by selectively removing the heat-resistant planarizing film;

forming a contact hole reaching the source region or the drain region by selectively removing the gate insulating film;

forming a conductive film on the first electrode and the heat-resistant planarizing film;

forming a source electrode or a drain electrode reaching the source region or the drain region, and a depression in the heat-resistant planarizing film by selectively removing the conductive film and the heat-resistant planarizing film;

forming a partition wall covering the source electrode or the drain electrode, an end portion of the first electrode, and the depression in the heat-resistant planarizing film;

forming a layer containing an organic compound on the first electrode;

forming a second electrode on the layer containing an organic compound; and encapsulating a display element including the first electrode, the layer containing an organic compound and the second electrode over the first substrate by pasting a second substrate to the first substrate with a sealant surrounding a peripheral portion of the display element, wherein a material of the partition wall is the same as a material of the heat-resistant planarizing film, and wherein the material of the heat-resistant planarizing film is a silicon oxide film containing an alkyl group.

20. A manufacturing method of a display device according to claim 19, wherein the heat-resistant planarizing film is formed by a coating method.

21. A manufacturing method of a display device according to claim 19, wherein the partition wall is a silicon oxide film containing an alkyl group formed by a coating method.

22. A manufacturing method of a display device according to claim 19, wherein the first electrode is formed by sputtering using a target of indium tin oxide containing silicon oxide.

23. A manufacturing method of a display device comprising the steps of:

forming a thin film transistor having a gate insulating film, a gate electrode and a semiconductor layer having a source region, a drain region and a channel forming region between the source and drain regions over a substrate with an insulating surface;

forming an insulating film over the thin film transistor;

selectively forming a first electrode over the insulating film;

forming an opening disposed above the source region or the drain region by selectively removing the insulating film;

forming a contact hole reaching the source region or the drain region by selectively removing the gate insulating film;

forming a conductive film on the first electrode and the insulating film;

forming a source electrode or a drain electrode reaching the source region or the drain region, and a depression in the insulating film by selectively removing the conductive film and the insulating film, and forming a partition wall covering the source electrode or the drain electrode, an end portion of the first electrode, and the depression in the insulating film, wherein a material of the partition wall is the same as a material of the insulating film, and wherein the material of the insulating film is a silicon oxide film containing an alkyl group.

24. A manufacturing method of a display device according to claim 23, wherein the insulating film is formed by a coating method.

25. A manufacturing method of a display device according to claim 23, wherein the first electrode is formed by sputtering using a target of indium tin oxide containing silicon oxide.

26. A manufacturing method of a display device comprising the steps of:

forming a thin film transistor having a gate insulating film, a gate electrode and a semiconductor layer having a source region, a drain region and a channel forming region between the source and drain regions over a substrate with an insulating surface;

forming a heat-resistant planarizing film over the thin film transistor;

selectively forming a first electrode over the heat-resistant planarizing film;

forming an opening disposed above the source region or the drain region by selectively removing the heat-resistant planarizing film;

forming a contact hole reaching the source region or the drain region by selectively removing the gate insulating film;

forming a conductive film on the first electrode and the heat-resistant planarizing film;

forming a source electrode or a drain electrode reaching the source region or the drain region, and a depression in the heat-resistant planarizing film by selectively removing the conductive film and the heat-resistant planarizing film, and forming a partition wall covering the source electrode or the drain electrode, an end portion of the first electrode and the depression in the heat-resistant planarizing film, wherein a material of the partition wall is the same as a material of the heat-resistant planarizing film, and wherein the material of the heat-resistant planarizing film is a silicon oxide film containing an alkyl group.

27. A manufacturing method of a display device according to claim 26, wherein the heat-resistant planarizing film is formed by a coating method.

28. A manufacturing method of a display device according to claim 26, wherein the first electrode is formed by sputtering using a target of indium tin oxide containing silicon oxide.

* * * * *